(12) United States Patent
Suzuki et al.

(10) Patent No.: US 9,293,723 B2
(45) Date of Patent: *Mar. 22, 2016

(54) LIGHT-EMITTING ELEMENT, LIGHT-EMITTING DEVICE, DISPLAY DEVICE, ELECTRONIC DEVICE, AND LIGHTING DEVICE

(71) Applicant: Semiconductor Energy Laboratory Co., Ltd., Kanagawa-ken (JP)

(72) Inventors: Tsunenori Suzuki, Kanagawa (JP); Nozomi Komatsu, Kanagawa (JP); Harue Osaka, Kanagawa (JP); Hiromi Seo, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/633,845

(22) Filed: Feb. 27, 2015

(65) Prior Publication Data

US 2015/0171358 A1    Jun. 18, 2015

Related U.S. Application Data

(63) Continuation of application No. 14/042,899, filed on Oct. 1, 2013, now Pat. No. 8,969,863.

(30) Foreign Application Priority Data

Oct. 3, 2012   (JP) ................. 2012-221243

(51) Int. Cl.
*H01L 51/50* (2006.01)
*H01L 51/00* (2006.01)

(52) U.S. Cl.
CPC ........ *H01L 51/5012* (2013.01); *H01L 51/5052* (2013.01); *H01L 51/5056* (2013.01);
(Continued)

(58) Field of Classification Search
CPC ............ H01L 51/5012; H01L 51/5052; H01L 51/5056; H01L 51/5088
USPC ............................... 257/40; 438/99
See application file for complete search history.

(56) References Cited

U.S. PATENT DOCUMENTS 5,935,721 A   8/1999  Shi et al.
6,057,048 A   5/2000  Hu et al.
(Continued)

FOREIGN PATENT DOCUMENTS

CN    001298623 A    6/2001
CN    001926925 A    3/2007
(Continued)

OTHER PUBLICATIONS

International Search Report re Application No. PCT/JP2013/076454, dated Dec. 17, 2013.

(Continued)

*Primary Examiner* — Allan R Wilson
(74) *Attorney, Agent, or Firm* — Husch Blackwell LLP

(57) ABSTRACT

Provided is a light-emitting element in which an adverse effect by halides in an EL layer is suppressed and which can be provided with low cost. The light-emitting element including at least two layers between an anode and a light-emitting layer. One of the two layers which is closer to the anode has higher concentration of halides and halogen elements than the other layer closer to the light-emitting layer.

11 Claims, 19 Drawing Sheets

(52) U.S. Cl.
CPC ......... *H01L51/5088* (2013.01); *H01L 51/0058* (2013.01); *H01L 51/0059* (2013.01); *H01L 51/0072* (2013.01); *H01L 51/0074* (2013.01)

(56) References Cited

U.S. PATENT DOCUMENTS

| | | | |
|---|---|---|---|
| 6,617,051 | B1 | 9/2003 | Higashi et al. |
| 7,045,950 | B2 | 5/2006 | Higashi et al. |
| 7,449,832 | B2* | 11/2008 | Itai .................. 313/504 |
| 7,528,545 | B2 | 5/2009 | Liao et al. |
| 8,319,212 | B2* | 11/2012 | Ibe et al. .......... 257/40 |
| 8,421,338 | B2 | 4/2013 | Kim et al. |
| 8,889,271 | B2* | 11/2014 | Park et al. ........ 428/690 |
| 9,079,920 | B2* | 7/2015 | Park et al. |
| 2004/0007971 | A1 | 1/2004 | Higashi et al. |
| 2006/0157728 | A1 | 7/2006 | Iou |
| 2006/0159959 | A1 | 7/2006 | Higashi et al. |
| 2006/0181202 | A1 | 8/2006 | Liao et al. |
| 2006/0182993 | A1 | 8/2006 | Ogata et al. |
| 2007/0172698 | A1 | 7/2007 | Iwakuma et al. |
| 2010/0052522 | A1 | 3/2010 | Kim et al. |
| 2011/0266531 | A1* | 11/2011 | Kim et al. .......... 257/40 |
| 2015/0053960 | A1* | 2/2015 | Park et al. ........ 257/40 |
| 2015/0179963 | A1* | 6/2015 | Bando et al. ...... 257/40 |

FOREIGN PATENT DOCUMENTS

| | | |
|---|---|---|
| EP | 1 063 869 A1 | 12/2000 |
| EP | 1 722 603 A1 | 11/2006 |
| JP | 2000-315580 A | 11/2000 |
| JP | 3290432 | 6/2002 |
| JP | 2002-373786 A | 12/2002 |
| JP | 2011-216903 A | 10/2011 |
| JP | 2013-133278 A | 7/2013 |
| KR | 2007-0004678 A | 1/2007 |
| TW | I245064 | 12/2005 |
| TW | I278252 | 4/2007 |
| WO | WO 00/41443 A1 | 7/2000 |
| WO | WO 2005/084083 A1 | 9/2005 |

OTHER PUBLICATIONS

Written Opinion re Application No. PCT/JP2013/076454, dated Dec. 17, 2013.

\* cited by examiner

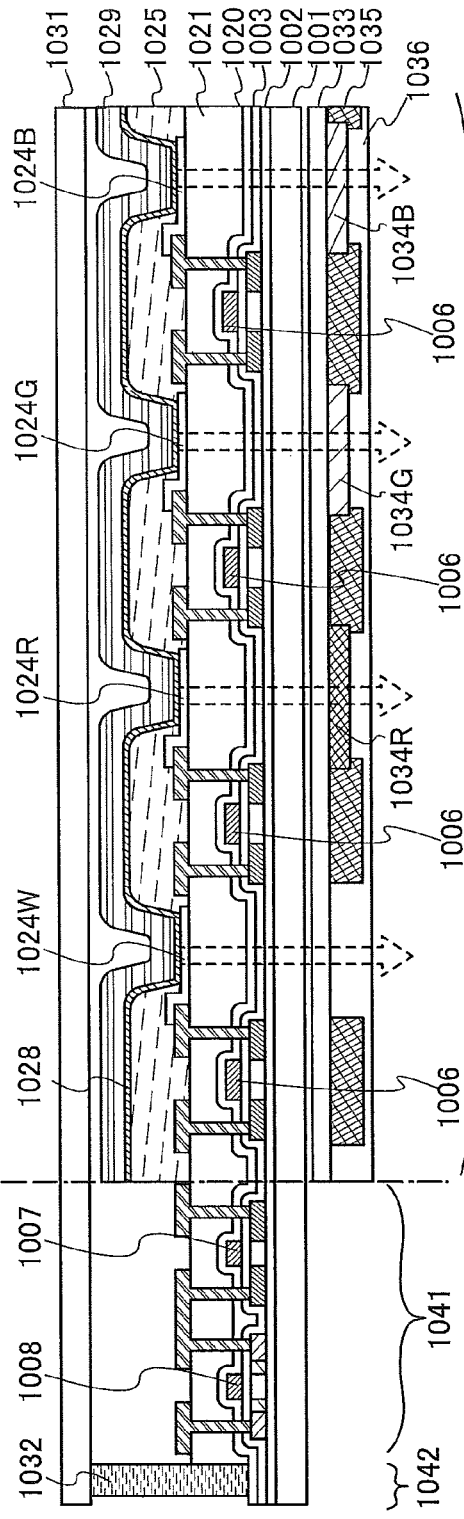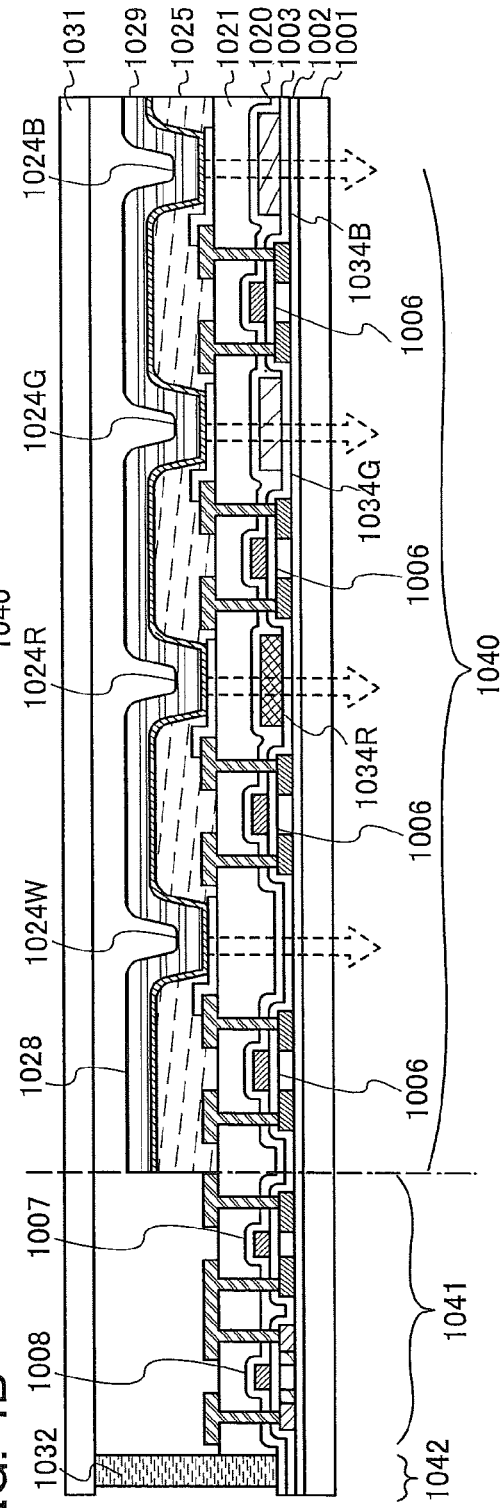
FIG. 4A
FIG. 4B

FIG. 8A
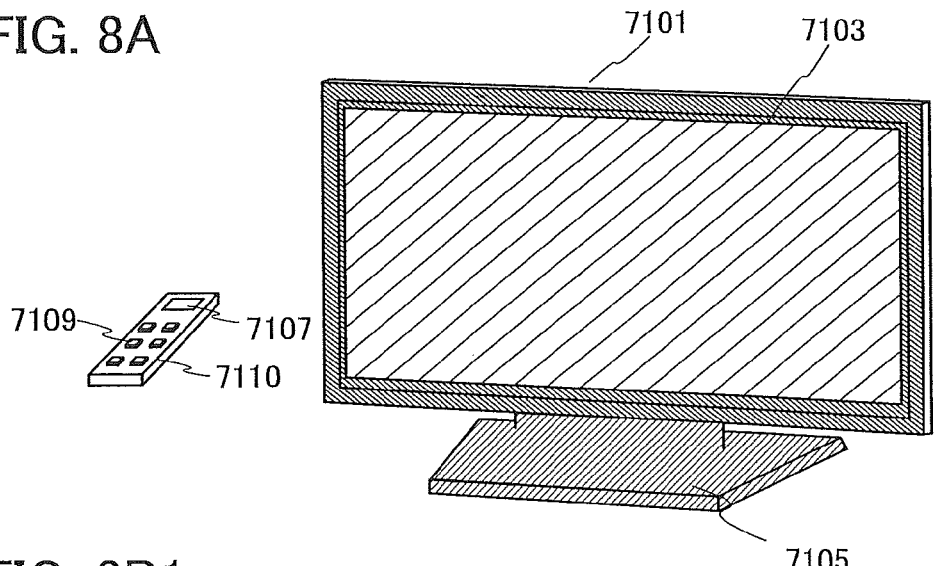
FIG. 8B1
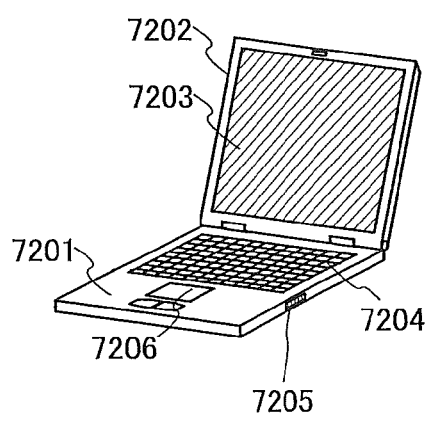
FIG. 8B2
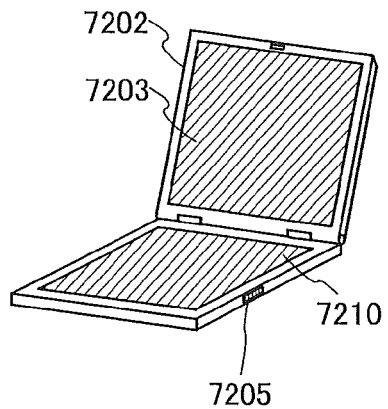
FIG. 8C
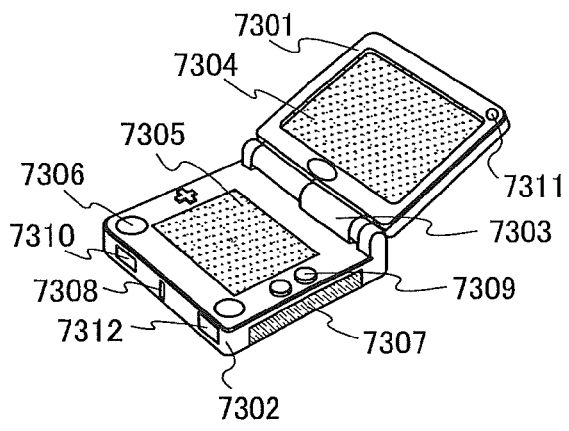
FIG. 8D
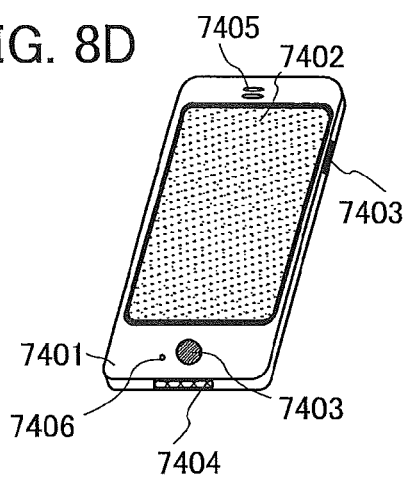

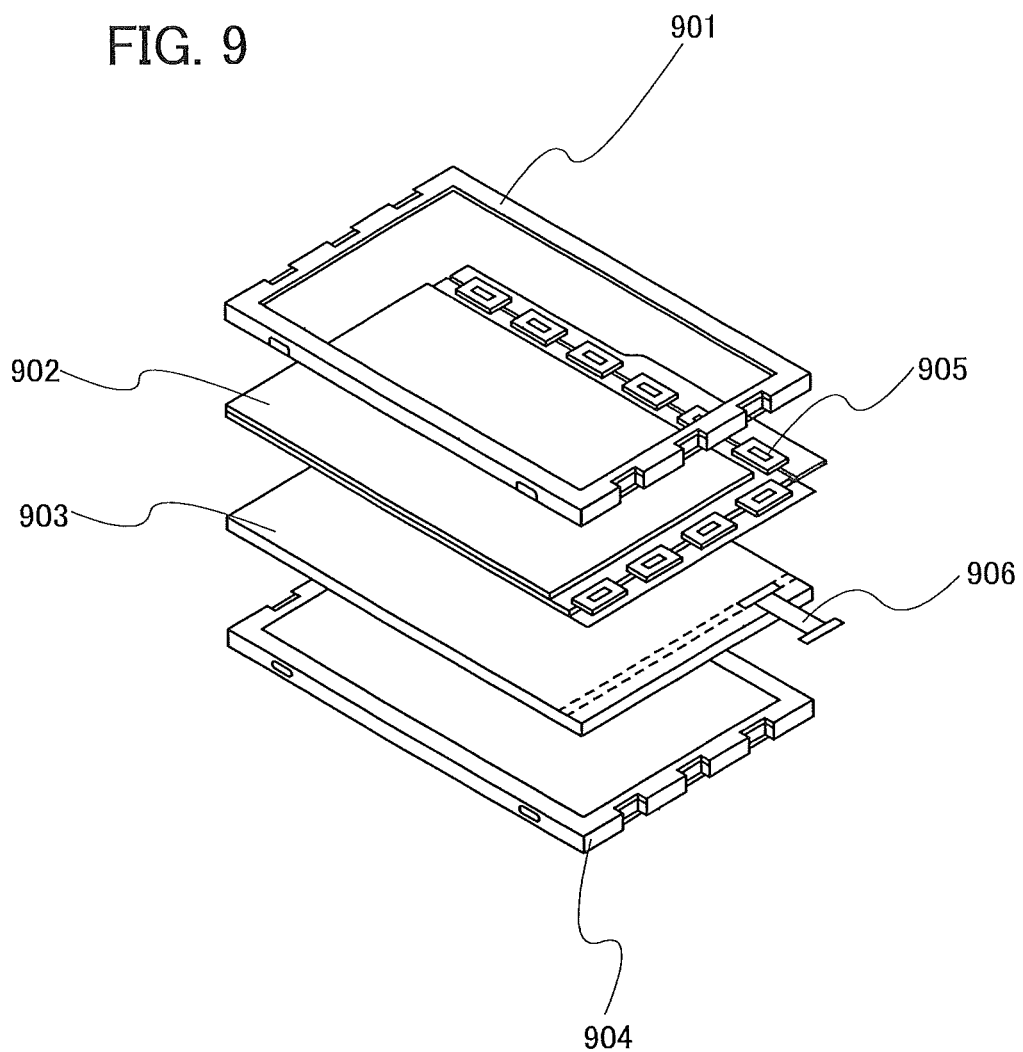

LIGHT-EMITTING ELEMENT, LIGHT-EMITTING DEVICE, DISPLAY DEVICE, ELECTRONIC DEVICE, AND LIGHTING DEVICE

This application is a continuation of copending U.S. application Ser. No. 14/042,899, filed on Oct. 1, 2013 which is incorporated herein by reference.

TECHNICAL FIELD

The present invention relates to a light-emitting element, a display device, a light-emitting device, an electronic device, and a lighting device each of which uses an organic compound as a light-emitting substance.

BACKGROUND ART

In recent years, research and development of a light-emitting element (organic EL element) which uses an organic compound and utilizes electroluminescence (EL) have been actively promoted. In the basic structure of such a light-emitting element, an organic compound layer containing a light-emitting substance (an EL layer) is interposed between a pair of electrodes. By applying voltage to this element, light emission from the light-emitting substance can be obtained.

Since such a light-emitting element is of self-light-emitting type, it is considered that the light-emitting element has advantages over a liquid crystal display in that visibility of pixels is high, backlight is not required, and so on and is therefore suitable as flat panel display elements. Besides, displays including such light-emitting elements have advantages in that it can be formed to be thin and lightweight, and has quite fast response speed.

In such a light-emitting element, light-emitting layers can be successively formed two-dimensionally, so that planar light-emission surface can be obtained. Therefore, large-area elements can be easily formed. This is a feature which is difficult to be obtained by point light sources typified by an incandescent lamp and an LED or linear light sources typified by a fluorescent lamp. Accordingly, the light-emitting element is extremely effective for use as a surface light source applicable to illumination and the like.

As described above, an organic EL element has various features; however, price is the biggest barrier to be overcome for diffusion.

The price of liquid crystal displays, which is a typical of flat panel displays, has been continuously declining and also the price of LED lightings is gradually declining. As long as the price difference between organic EL elements and these preceding products is too large, the diffusion of organic EL devices is not promoted even though they have many advantages other products do not have.

Additionally, the basic performance such as lifetime, power consumption, and the like have to be equivalent to or better than other competing products than the problem of price.

Patent Document 1 focuses on a halide contained in an organic compound included in an EL layer and discloses a light-emitting element with long lifetime obtained by limiting the concentration of halides to a certain level.

REFERENCE

Patent Document

[Patent Document 1] Patent Document No. JP-3290432

DISCLOSURE OF INVENTION

In order to limit the concentration of halides in an EL layer to a certain level as in Patent Document 1, precise adjustments to purification of a material and a manufacturing atmosphere are required, which leads to an increase of costs for materials or manufacture.

In view of the above, an object of one embodiment of the present invention is to provide a light-emitting element in which an adverse effect by halides in an EL layer is suppressed, with low costs for materials or manufacture.

Another object of one embodiment of the present invention is to provide a light-emitting device, a display device, an electronic device, and a lighting device each of which can be manufactured at low cost by using any of the above-described light-emitting elements.

It is only necessary that at least one of the above-described objects be achieved in the present invention.

The inventors found that, it is possible to solve the above problems by designing a light-emitting element so that at least two layers are included between an anode and a light-emitting layer and that one of the layers which is closer to the anode has higher concentration of halides and halogen elements than the other layer closer to the light-emitting layer.

One embodiment of the present invention is a light-emitting element including an anode, a cathode, and an EL layer between the anode and the cathode. The EL layer includes at least a first layer, a second layer, and a light-emitting layer in this order from the anode side. The concentration of halides and halogen elements contained in the first layer is larger than that in the second layer. Here, the halide in the first layer and the second layer is detected as an impurity.

Another embodiment of the present invention is a light-emitting element including an anode, a cathode, and an EL layer between the anode and the cathode. The EL layer includes at least a first layer, a second layer, and a light-emitting layer in this order from the anode side. The amount of a halogen element contained in the second layer detected by dynamic secondary ion mass spectrometry (D-SIMS) is less than $\frac{1}{10000}$ of that of carbon in the same analysis. The amount of the halogen element contained in the first layer is larger than that in the second layer.

Another embodiment of the present invention is a light-emitting element having the above structure, in which the amount of the halogen element in the first layer, which is detected by D-SIMS, is more than or equal to $\frac{1}{10000}$ and less than or equal to $\frac{1}{100}$ of that of carbon in the same analysis.

Another embodiment of the present invention is a light-emitting element having the above structure, in which the light-emitting layer has a hole-transport property higher than an electron-transport property.

Another embodiment of the present invention is a light-emitting element having the above structure, in which the first layer is a composite film of an organic compound having a hole-transport property and a substance exhibiting an acceptor property with respect to the organic compound.

Another embodiment of the present invention is a light-emitting element having the above structure, in which the organic compound includes a dibenzothiophene skeleton or a dibenzofuran skeleton.

Another embodiment of the present invention is a light-emitting element having the above structure, in which the organic compound is 4,4',4''-(1,3,5-benzenetriyl)tri(dibenzothiophene) or 4,4',4''-(1,3,5-benzenetriyl)tri(dibenzofuran).

Another embodiment of the present invention is a light-emitting element having the above structure, in which the first layer is a hole-injection layer and the second layer is a hole-transport layer.

Another embodiment of the present invention is a lighting device which includes the light-emitting element having any of the above-described structures.

Another embodiment of the present invention is a light-emitting device which includes the light-emitting element having any of the above-described structures and a means which controls the light-emitting element.

Another embodiment of the present invention is a display device which includes the light-emitting element having any of the above-described structures in a display portion and a means which controls the light-emitting element.

Another embodiment of the present invention is an electronic device which includes the light-emitting element having any of the above-described structures.

The light-emitting device in this specification includes an image display device that uses a light-emitting element. Further, the category of the light-emitting device in this specification includes a module in which a light-emitting element is provided with a connector such as an anisotropic conductive film or a TCP (tape carrier package); a module in which the end of the TCP is provided with a printed wiring board; and a module in which an IC (integrated circuit) is directly mounted on a light-emitting element by a COG (chip on glass) method. Furthermore, the category includes light-emitting devices that are used in lighting equipment or the like.

According to one embodiment of the present invention, a light-emitting element in which an adverse effect by halides in an EL layer is suppressed can be provided with low costs for materials or manufacture.

According to another embodiment of the present invention, a light-emitting device, a display device, an electronic device, and a lighting device each of which can be manufactured at low cost by using the above-described light-emitting element can be provided.

BRIEF DESCRIPTION OF DRAWINGS

FIGS. 4A and 4B are conceptual diagrams of an active matrix light-emitting device.

FIGS. 8A to 8D illustrate electronic devices.

FIG. 9 illustrates an electronic device.

BEST MODE FOR CARRYING OUT THE INVENTION

Figure 1:
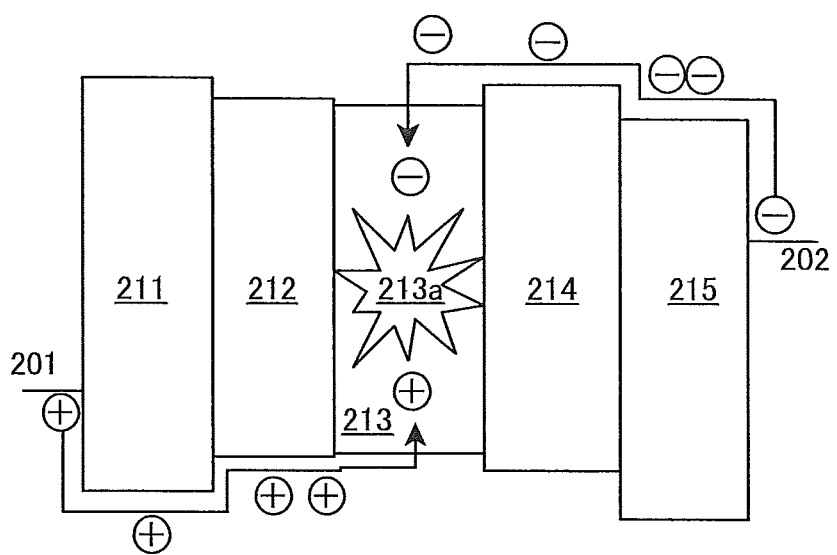
FIG. 1 is a conceptual diagram of a light-emitting element.

Hereinafter, embodiments of the present invention will be described with reference to the drawings. Note that the invention is not limited to the following description, and it will be easily understood by those skilled in the art that various changes and modifications can be made without departing from the spirit and scope of the invention. Therefore, the invention should not be construed as being limited to the description in the following embodiments.

Embodiment 1

It is generally believed that materials of a light-emitting element should contain an impurity as little as possible. It is known that the impurity heavily affects the light-emitting element, particularly durability (lifetime) thereof.

Most of the impurities are a decomposed matter of the material and a by-product or an unreacted starting material in the synthesis of the material. In particular, halides heavily affect the durability of a light-emitting element; however, a material for a light-emitting element, which is often synthesized by a coupling reaction of halides, is difficult to be removed. In view of the above, three elements with varied concentrations of halides in a hole-transport material used for a hole-transport layer which is in contact with a light-emitting layer were formed, and change in luminance of the three elements over driving time was measured. Note that each of the light-emitting elements used here is regarded to have a carrier recombination region which is distributed from the light-emitting layer to the vicinity of the interface with the hole-transport layer.

The concentration of halides was calculated from the ratio of peak areas of a chromatogram obtained by using an UV-detector of a liquid chromatography. Waters Acquity UPLC™ system, produced by Waters was used as an analysis apparatus. Measurement using a detector equipped with a Time-of-Flight mass spectrometer (TOF-MS) was further performed on a material which cannot be detected by the aforementioned analysis due to the extremely small amount of the halides.

A material in which the amount of the halides was below the detection limit of the TOF-MS was used for a hole-transport layer which is in contact with a light-emitting layer of a light-emitting element A. A material in which the halides were contained at less than 0.1% was used for a hole-transport layer which is in contact with a light-emitting layer of a light-emitting element B. A material in which the halides were contained at about 4% was used for a hole-transport layer which is in contact with a light-emitting layer of a light-emitting element C. Other materials and structures are the same among the light-emitting elements A to C.

According to the results, as the amount of the halides contained in the hole-transport layer was larger, lifetime of the light-emitting elements was clearly shorten; there was a difference as large as 100 times or more between the lifetime of the light-emitting elements A and C.

Next, luminance degradation over driving time was evaluated with respect to the three elements which are different in the concentration of halides contained in the hole-transport material used for the hole-injection layer between the hole-transport layer and the anode.

A material in which the amount of the halides was below the detection limit of the TOF-MS was used for a hole-injection layer of a light-emitting element D. A material in which the halides were contained at less than 0.1% was used for a hole-injection layer of a light-emitting element E. A material in which the halides were contained at about 4% was used for a hole-injection layer of a light-emitting element F. Other materials and structures are the same among the light-emitting elements D to F. Note that the hole-transport materials used for the hole-injection layer of the light-emitting elements D to F are the same as those of the light-emitting elements A to C.

As a result of the measurement, it was found that the lifetime of the light-emitting elements D to F were nearly equivalent to one another.

The difference in the lifetime was over 100 times among the light-emitting elements having different concentrations of halides in the hole-transport layers which are in contact with the light-emitting layers, whereas there was not a significant difference among the light-emitting elements having different concentrations of halides in the hole-injection layers which are provided between the hole-transport layers and the anodes. From the results, it was found that problems do not easily occur even if the hole-transport material used for the hole-injection layer includes a relatively large amount of halides. This shows that the lifetime of a light-emitting element is sensitive to the concentration of halides in a layer closer to a carrier recombination region, whereas it is relatively insensitive to the concentration of halides in a layer that is far away from the light-emitting layer.

In organic synthesis, reaction using halides as a raw material, which is typified by Suzuki coupling, is often used because conjugated molecules can be readily synthesized with high yield and low cost. However, as mentioned above, when the reaction is applied to the synthesis of a material for a semiconductor device such as an organic EL, a trace amount of residual halides heavily affect the device characteristics. Thus, the residual halides need to be removed carefully. Additionally, a high-temperature treatment such as sublimation purification might cause migration of halogen elements from halides to an objective (a main material), resulting in a halide of the objective (halogen adduct). In this case, the sublimation temperatures of the halogen adduct and the objective can be close to each other, so that separation may be difficult. In order to remove the halogen adduct, purification needs to be repeated; accordingly, yield is reduced and the price is increased. If a hole-transport material containing relatively large amount of halides can be used for the hole-injection layer, the cost is cut significantly. Further, there is a case where the hole-injection layer is used for adjusting optical distance of the light-emitting element, e.g., for formation of microcavity. In this case, the hole-injection layer is increased in thickness and a large amount of the hole-transport material is used, which produces larger effect of cost reduction.

That is, the light-emitting element in which the concentration of halides in the hole-injection layer which is the first layer and provided between the hole-transport layer and the anode is higher than that in the hole-transport layer which is the second layer and in contact with the light-emitting layer can be inexpensively manufactured without influencing durability.

FIG. 1 shows an example of an energy band diagram (model) of a light-emitting element according to an embodiment of the invention. Holes injected from an anode 201 to a hole-injection layer 211 reach a light-emitting layer 213 through a hole-transport layer 212. In a similar way, electrons injected from a cathode 202 to an electron-injection layer 215 reach the light-emitting layer 213 through an electron-injection layer 214. As a result, the electrons and the holes are recombined and emit light in the light-emitting layer 213. A region 213a where the holes and the electrons are recombined (light-emitting region) is formed in the light-emitting layer 213.

When a halide exists in the region close to the light-emitting region 213a, durability (lifetime) of the light-emitting element is adversely affected. On the other hand, halides in a region that is far enough away from the light-emitting region 213a, i.e., in the hole-injection layer 211 in this model, do not affect the light-emitting element so much.

In FIG. 1, the hole-injection layer 211 and the hole-transport layer 212 correspond to a first layer and a second layer, respectively. The light-emitting element in which the concentration of halides in the hole-injection layer 211, which is the first layer and provided between the hole-transport layer and the anode, is higher than the concentration of halides in the hole-transport layer 212, which is the second layer and in contact with the light-emitting layer, can be inexpensively manufactured without influencing durability.

Figure 2A:
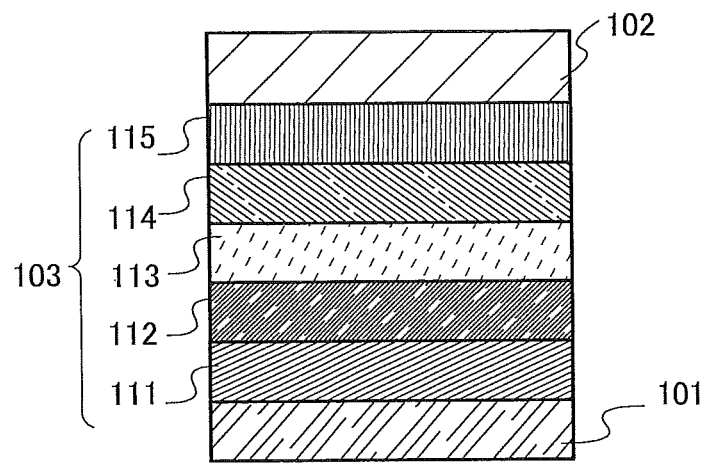
FIGS. 2A and 2B are conceptual diagrams of light-emitting elements.
Figure 2B:
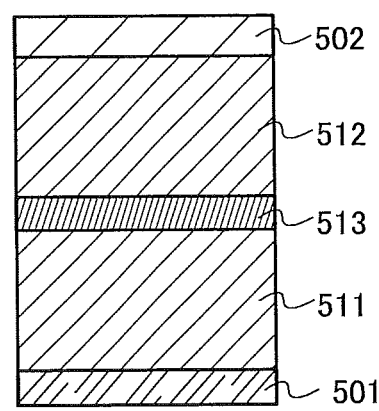

FIGS. 2A and 2B each illustrate a light-emitting element of one embodiment of the present invention. In the light-emitting element of this embodiment, an EL layer 103 is sandwiched between a first electrode 101 and a second electrode 102. One of the first electrode 101 and the second electrode 102 functions as an anode and the other functions as a cathode. Note that in FIGS. 2A and 2B, the first electrode 101 functions as an anode, and the second electrode 102 functions as a cathode.

The EL layer 103 includes at least a first layer 111, a second layer 112, and a light-emitting layer 113 in this order from the anode side. There is no particular limitation on the other layers in the EL layer 103; for example, an electron-transport layer 114, an electron-injection layer 115, and the like are included as illustrated in FIGS. 2A and 2B. Although the first layer 111 and the second layer 112 correspond to, typically, a hole-injection layer and a hole-transport layer, respectively, the layers are not limited thereto. The first layer 111 and the second layer 112 are distinguished from each other by the concentration of halides. The light-emitting element in this embodiment is characterized in that the concentration of halides of the first layer 111 is higher than that of the second layer 112.

As described above, since a halide is often mixed in the synthesis process of the material, a bromide or a chloride are readily mixed to the material and tend to influence durability of the element. Hence, a material having lower concentration of a bromide or a chloride is used for the second layer 112, and a material having higher concentration of a bromide or a chloride than the material in the second layer 112 is used for the first layer 111; thus, the light-emitting element can be manufactured at low cost without influencing durability.

With this structure, a decrease in the lifetime due to the influence of halides can be suppressed, and an inexpensive material can be used for the first layer 111. Thus, a light-emitting element can be provided, without any influence on durability, with lower cost than in the case of using a material with high purity for both the first layer 111 and the second layer 112.

As for the concentration of halides of the second layer 112, it is preferable that the amount of halogen elements detected by D-SIMS be less than 1/10000 (further preferably, less than 1/100000) of that of carbon detected by the same analysis because the influence on the lifetime can be more effectively counteracted.

In the case where the electron-transport property is higher than the hole-transport property in the light-emitting layer, a carrier-recombination region exists near the interface between the second layer 112 and the light-emitting layer 113 and thus the durability of the light-emitting layer tends to be affected by halides. For this reason, the above-described structure is preferably employed.

Similarly, the amount of halides contained in the light-emitting layer 113 functioning as a light-emitting region is preferably less than the amount of halides in the first layer 111 (i.e., the concentration of halides of the light-emitting layer 113 is as low as that of the second layer 112).

Note that the amount of halogen elements of the first layer 111 detected by D-SIMS may be 1/10000 or more of the amount of carbon detected by the same analysis. When the amount of halogen elements detected by D-SIMS is 1/100 or less of that of carbon, the light-emitting element is less influenced. In addition, it is preferable that the amount of halogen elements detected by D-SIMS be 1/10000 or more of the amount of carbon detected by the same analysis because cost advantage is enhanced.

Embodiment 2

In this embodiment, a detailed example of the structure of the light-emitting element in Embodiment 1 will be described with reference to FIGS. 2A and 2B.

In FIG. 2A, the light-emitting element includes the first electrode 101, the second electrode 102, and the EL layer 103, which is provided between the first electrode 101 and the second electrode 102. Note that in this embodiment, the first electrode 101 functions as an anode and the second electrode 102 functions as a cathode. In other words, when a voltage is applied between the first electrode 101 and the second electrode 102 so that the potential of the first electrode 101 is higher than that of the second electrode 102, light emission can be obtained. The EL layer has a stacked-layer structure in which at least the first layer 111, the second layer 112, and the light-emitting layer 113 are stacked from the first electrode 101 side.

Since the first electrode 101 functions as the anode, the first electrode 101 is preferably formed using any of metals, alloys, electrically conductive compounds with a high work function (specifically, a work function of 4.0 eV or more), mixtures thereof, and the like. Specific examples are indium oxide-tin oxide (ITO: indium tin oxide), indium oxide-tin oxide containing silicon or silicon oxide, indium oxide-zinc oxide, indium oxide containing tungsten oxide and zinc oxide (IWZO), and the like. Such conductive metal oxide films are usually formed by a sputtering method, but may also be formed by application of a sol-gel method or the like. For example, indium oxide-zinc oxide is deposited by a sputtering method using a target obtained by adding 1 wt % to 20 wt % of zinc oxide to indium oxide. Alternatively, a film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal (such as titanium nitride), or the like can be used. Graphene can also be used. Note that when a composite material described later is used for the first layer 111, an electrode material can be selected regardless of its work function.

There is no particular limitation on the stacked-layer structure of the EL layer 103 as long as the first layer 111, the second layer 112, and the light-emitting layer 113 have the structure described in Embodiment 1. For example, the EL layer 103 can be formed by combining an electron-transport layer, an electron-injection layer, a carrier-blocking layer, an intermediate layer, and the like as appropriate. In this embodiment, the EL layer 103 has a structure in which a hole-injection layer, a hole-transport layer, a light-emitting layer 113, an electron-transport layer 114, and an electron-injection layer 115 are stacked in this order over the first electrode 101. Specific materials for forming the layers will be given below. Note that the hole-injection layer and the hole-transport layer correspond to the first layer 111 and the second layer 112, respectively, in this embodiment; however, the first layer and the second layer do not necessarily correspond to these layers, and one of two layers between the anode and the cathode, which exists on the light-emitting layer 113 side, corresponds to the second layer 112, and the other layer which exists between the second layer 112 and the anode corresponds to the first layer 111.

The hole-injection layer has a high hole-injection property. For example, molybdenum oxide, vanadium oxide, ruthenium oxide, tungsten oxide, manganese oxide, or the like can be used. Alternatively, the hole-injection layer can be formed using a phthalocyanine-based compound such as phthalocyanine (abbreviation: H$_2$Pc) or copper phthalocyanine (abbreviation: CuPC), an aromatic amine compound such as 4,4'-bis[N-(4-diphenylaminophenyl)-N-phenylamino]biphenyl (abbreviation: DPAB) or N,N'-bis{4-[bis(3-methylphenyl)amino]phenyl}-N,N'-diphenyl-(1,1'-biphenyl)-4,4'-dia mine (abbreviation: DNTPD), a high molecular compound such as poly(ethylenedioxythiophene)/poly(styrenesulfonic acid) (abbreviation: PEDOT/PSS), or the like. Note that the first layer preferably has a thickness of 30 nm or more or 50 nm or more.

Alternatively, a composite material in which a material having a hole-transport property contains a material having an acceptor property can be used, by which selection of a material used to form an electrode can be carried out regardless of work function. In other words, besides a material having a high work function, a material having a low work function can also be used for the first electrode 101. As the acceptor substance, 7,7,8,8-tetracyano-2,3,5,6-tetrafluoro-quinodimethane (abbreviation: F$_4$-TCNQ), chloranil, and the like can be given. A transition metal oxide can be given. For example, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable since their electron-accepting property is high. Among these, molybdenum oxide is especially preferable due to its stability in the air, low hygroscopic property, and facility in handling.

As the material having a hole-transport property used for the composite material, any of a variety of organic compounds such as aromatic amine compounds, carbazole derivatives, and aromatic hydrocarbons can be used. These organic compounds can be high molecular-weight compound (including oligomers, dendrimers, and polymers). The organic compound used for the composite material is preferably an organic compound having a high hole-transport property. Specifically, a substance having a hole mobility of $10^{-6}$ $cm^2/Vs$ or higher is preferably used. Organic compounds which can be used as the material having a hole-transport property in the composite material are specifically given below.

As aromatic amine compounds, for example, there are N,N'-di(p-tolyl)-N,N'-diphenyl-p-phenylenediamine (abbreviation: DTDPPA), DPAB, DNTPD, 1,3,5-tris[N-(4-diphenylaminophenyl)-N-phenylamino]benzene (abbreviation: DPA3B), and the like.

As carbazole derivatives which can be used for the composite material, the following can be given specifically: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like.

In addition, examples of the carbazole derivatives which can be used for the composite material include 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbon which can be used for the composite material include 2-tert-butyl-9,10-di(2-naphthyl)anthracene (abbreviation: t-BuDNA); 2-tert-butyl-9,10-di(1-naphthyl)anthracene; 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 2-tert-butyl-9,10-bis[2-(1-naphthyl)phenyl]anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; and 2,5,8,11-tetra(tert-butyl)perylene. Besides those, pentacene, coronene, or the like can also be used. As these examples, the aromatic hydrocarbon which has a hole mobility of $1\times10^{-6}$ $cm^2/Vs$ or higher and which has 14 to 42 carbon atoms is particularly preferable.

The aromatic hydrocarbon which can be used for the composite material may have a vinyl skeleton. The following are given for example: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

Moreover, a high molecular compound such as poly(N-vinylcarbazole) (abbr.: PVK), poly(4-vinyltriphenylamine) (abbr.: PVTPA), poly[N-(4-{N'-[4-(4-diphenylamino)phenyl]phenyl-N'-phenylamino}phenyl)methacrylamide](abbr.: PTPDMA), or poly[N,N'-bis(4-butylphenyl)-N,N'-bis(phenyl)benzidine (abbr.: Poly-TPD) can also be used.

Since the hole-transport property is improved owing to the hole-injection layer, a light-emitting element having a small drive voltage can be obtained.

The hole-transport layer contains a material having a hole-transport property. Their examples include aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), and the like. The substances mentioned here have high hole-transport properties and are mainly ones that have a hole mobility of $10^{-6}$ $cm^2/Vs$ or more. An organic compound given as the example of the material having a hole-transport property in the composite material described above can also be used for the hole-transport layer. Note that the layer containing a material having a hole-transport property is not limited to a single layer, and may be a stack of two or more layers containing any of the above materials. The second layer preferably has a thickness smaller than that of the first layer.

The hole-injection layer which is the first layer 111 and the hole-transport layer which is the second layer 112 have the structure and the relation described in Embodiment 1. That is, the hole-injection layer contains more halogen elements derived from halides than the hole-transport layer. Thus, a material with low purity and a material with high purity are used for the hole-injection layer and the hole-transport layer, respectively. This makes it possible to manufacture a light-emitting element with lower cost than the case of using a material with high purity for these layers. In addition, since a material with high purity is used for the hole-transport layer adjacent to the light-emitting layer 113, an adverse effect of halides or halogen elements on the light-emitting element, i.e., the decrease of durability can be suppressed.

As the halide, a bromide and a chloride tend to be contained into the light-emitting element, in the light-emitting element of this embodiment, the concentrations of a bromide (bromine element) and a chloride (chlorine element) preferably have the above relation. The above relation with respect to a bromide (bromine element) is especially preferred.

The light-emitting layer 113 is a layer containing a light-emitting substance. Either a fluorescent substance or a phosphorescent substance can be used as the light-emitting substance. In addition, the light-emitting layer may contain only the light-emitting substance or may have a structure in which light-emitting substances are dispersed in a host material.

Note that in the case where the electron-transport property is higher than the hole-transport property in the light-emitting layer 113, a carrier recombination region is formed in the vicinity of the interface between the second layer 112 (the hole-transport layer) and the light-emitting layer. Thus, the light-emitting layer tends to be affected by halides (halogen elements) in the hole-transport layer. For this reason, the element structure of this embodiment is preferably employed.

Examples of materials which can be used as the phosphorescent substance are as follows.

The following are the specific examples: an organometallic iridium complex having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), or tris[4-(3-biphenyl)-5-isopropyl-3-phenyl-4H-1,2,4-triazolato]iridium (III) (abbreviation: Ir(iPrptz-3b)₃); an organometallic iridium complex having a 1H-triazole skeleton, such as tris[3-methyl-1-(2-methylphenyl)-5-phenyl-1H-1,2,4-triazolato]iridium (III) (abbreviation: Ir(Mptz1-mp)₃) or tris(1-methyl-2-phenyl-4-propyl-4H-1,2,4-triazolato)iridium(III) (abbreviation: Ir(Prptz1-Me)₃); an organometallic iridium complex having an imidazole skeleton, such as fac-tris[1-(2,6-diisopropylphenyl)-2-phenyl-1H-imidazole]iridium(III) (abbreviation: Ir(iPrpmi)₃), or tris[3-(2,6-dimethylphenyl)-7-methylimidazo[1,2-f]phenanthridinato]iridium(III) (abbreviation: Ir(dmpimpt-Me)₃); and an organometallic iridium complex in which a phenylpyridine derivative having an electron-withdrawing group is a ligand, such as bis[2-(4',6'-difluorophenyl)pyridinato-N,C²']iridium(III) tetrakis(1-pyrazolyl)borate (abbreviation: FIr6), bis[2-(4',6'-difluorophenyl)pyridinato-N,C²']iridium(III) picolinate (abbreviation: FIrpic), bis[2-(3',5'-bistrifluoromethylphenyl)pyridinato-N,C²']iridium(III)picolinate (abbreviation: Ir(CF₃ppy)₂(pic)), or bis[2-(4',6'-difluorophenyl)pyridinato-N,C²']iridium(III) acetylacetonate (abbreviation: FIracac). These are compounds emitting blue phosphorescence and have an emission peak at 440 nm to 520 nm.

Other examples include organometallic iridium complexes having pyrimidine skeletons, such as tris(4-methyl-6-phenylpyrimidinato)iridium(III) (abbreviation: [Ir(mppm)₃]), tris(4-t-butyl-6-phenylpyrimidinato)iridium(III) (abbreviation: [Ir(tBuppm)₃]), (acetylacetonato)bis(6-methyl-4-phenylpyrimidinato)iridium(III) (abbreviation: [Ir(mppm)₂(acac)]), (acetylacetonato)bis(6-tert-butyl-4-phenylpyrimidinato)iridium(III) (abbreviation: [Ir(tBuppm)₂(acac)]), (acetylacetonato)bis[6-(2-norbornyl)-4-phenylpyrimidinato]iridium(III) (abbreviation: [Ir(nbppm)₂(acac)]), (acetylacetonato)bis[5-methyl-6-(2-methylphenyl)-4-phenylpyrimidinato]iridium(III) (abbreviation: [Ir(mpmppm)₂(acac)]), and (acetylacetonato)bis(4,6-diphenylpyrimidinato)iridium(III) (abbreviation: [Ir(dppm)₂(acac)]); organometallic iridium complexes having pyrazine skeletons, such as (acetylacetonato)bis(3,5-dimethyl-2-phenylpyrazinato)iridium(III) (abbreviation: [Ir(mppr-Me)₂(acac)]) and (acetylacetonato)bis(5-isopropyl-3-methyl-2-phenylpyrazinato)iridium(III) (abbreviation: [Ir(mppr-iPr)₂(acac)]); organometallic iridium complexes having pyridine skeletons, such as tris(2-phenylpyridinato-N,C²')iridium(III) (abbreviation: [Ir(ppy)₃]), bis(2-phenylpyridinato-N,C²')iridium(III) acetylacetonate (abbreviation: [Ir(ppy)₂(acac)]), bis(benzo[h]quinolinato)iridium(III) acetylacetonate (abbreviation: [Ir(bzq)₂(acac)]), tris(benzo[h]quinolinato)iridium (III) (abbreviation: [Ir(bzq)₃]), tris(2-phenylquinolinato-N,C²')iridium(III) (abbreviation: [Ir(pq)₃]), and bis(2-phenylquinolinato-N,C²')iridium(III) acetylacetonate (abbreviation: [Ir(pq)₂(acac)]); and a rare earth metal complex such as tris(acetylacetonato) (monophenanthroline)terbium(III) (abbreviation: [Tb(acac)₃(Phen)]). These are mainly compounds emitting green phosphorescence and have an emission peak at 500 nm to 600 nm. Note that an organometallic iridium complex having a pyrimidine skeleton has distinctively high reliability and emission efficiency and thus is especially preferable.

For example, organometallic iridium complexes having pyrimidine skeletons, such as (diisobutyrylmethanato)bis[4,6-bis(3-methylphenyl)pyrimidinato]iridium(III) (abbreviation: Ir(5mdppm)₂(dibm)), bis[4,6-bis(3-methylphenyl)pyrimidinato](dipivaloylmethanato)iridium(III) (abbreviation: Ir(5mdppm)₂(dpm)), and bis[4,6-di(naphthalen-1-yl)pyrimidinato](dipivaloylmethanato)iridium(III) (abbreviation: Ir(d1npm)₂(dpm)); organometallic iridium complexes having pyrazine skeletons, such as (acetylacetonato)bis(2,3,5-triphenylpyrazinato)iridium(III) (abbreviation: Ir(tppr)₂(acac)), bis(2,3,5-triphenylpyrazinato) (dipivaloylmethanato)iridium(III) (abbreviation: Ir(tppr)₂(dpm)), and (acetylacetonato)bis[2,3-bis(4-fluorophenyl) quinoxalinato]iridium(III) (abbreviation: Ir(Fdpq)₂(acac)); organometallic iridium complexes having pyridine skeletons, such as tris(1-phenylisoquinolinato-N,C²')iridium(III) (abbreviation: Ir(piq)₃) and bis(1-phenylisoquinolinato-N,C²') iridium(III) acetylacetonate (abbreviation: Ir(piq)₂(acac)); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato) (monophenanthroline)europium(III) (abbreviation: Eu(DBM)₃(Phen)) and tris[1-(2-thenoyl)-3,3,3-trifluoroacetonato](monophenanthroline)europium(III) (abbreviation: Eu(TTA)₃(Phen)) are given. These are compounds emitting red phosphorescence and have an emission peak at 600 nm to 700 nm. Further, the organometallic iridium complex having a pyrazine skeleton can provide red light emission with favorable chromaticity.

Known phosphorescent materials, other than the phosphorescent compounds given above, may be selected and used.

Examples of a material which can be used as the fluorescent substance are the following materials:

5,6-bis[4-(10-phenyl-9-anthryl)phenyl]-2,2'-bipyridine (abbreviation: PAP2BPy), 5,6-bis[4'-(10-phenyl-9-anthryl) biphenyl-4-yl]-2,2'-bipyridine (abbreviation: PAPP2BPy), N,N'-bis[4-(9-phenyl-9H-fluoren-9-yl)phenyl]-N,N'-diphenyl-pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-dia mine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl) triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl) phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N',N'-triphenyl-1,4-phenylenediamine](abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chhrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11- diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[i]quinolizin-9-yl)ethenyl]-4H-pyran-4-ylidene}propanedinitrile (abbreviation: BisDCJTM), and the like. Condensed aromatic diamine compounds typified by pyrenediamine compounds such as 1,6FLPAPrn and 1,6mMemFLPAPrn are particularly preferable because of their high hole-trapping properties, high emission efficiency, and high reliability.

There is no particular limitation on the host materials and a variety of carrier-transport materials can be used.

Examples of the material having an electron-transport property (material which easily accepts electrons) include a heterocyclic compound having a polyazole skeleton, such as bis(10-hydroxybenzo[h]quinolinato)beryllium(II) (abbreviation: BeBq$_2$), bis(2-methyl-8-quinolinolato) (4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); a heterocyclic compound having a polyazole skeleton such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBTBIm-II); a heterocyclic compound having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), or 4,6-bis[3-(4-dibenzothienyl)phenyl]pyrimidine (abbreviation: 4,6mDBTP2Pm-II); and a heterocyclic compound having a pyridine skeleton, such as 2-[3'-(dibenzothiophen-4-yl)biphenyl-3-yl]dibenzo[f,h]quinoline (abbreviation: 2mDBTBPDBQu-II), 3,5-bis[3-(9H-carbazol-9-yl)phenyl]pyridine (abbreviation: 35DCzPPy), or 1,3,5-tri[3-(3-pyridyl)phenyl]benzene (abbreviation: TmPyPB). Among them, a heterocyclic compound having a diazine skeleton and a heterocyclic compound having a pyridine skeleton have high reliability and are thus preferable. Specifically, a heterocyclic compound having a diazine (pyrimidine or pyrazine) skeleton has a high electron-transport property to contribute to a reduction in driving voltage.

Note that in the case of using a fluorescent substance, particularly a fluorescent substance exhibiting blue light, a compound having an anthracene skeleton is preferably used as a host material because of the stability of the light-emitting element. Since the compound having an anthracene skeleton often has a higher electron-transport property than a hole-transport property, one embodiment of the present invention can be preferably employed.

As a material having a hole-transport property, following compounds can be exemplified: a compound having an aromatic amine skeleton, such as NPB, TPD, BSPB, BPAFLP, 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF); a compound having a carbazole skeleton, such as 1,3-bis(N-carbazolyl)benzene (abbreviation: mCP), CBP, 3,6-bis(3,5-diphenylphenyl)-9-phenylcarbazole (abbreviation: CzTP), or 3,3'-bis(9-phenyl-9H-carbazole) (abbreviation: PCCP); a compound having a thiophene skeleton such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton, such as 4,4',4"-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among them, a compound having an aromatic amine skeleton and a compound having a carbazole skeleton are preferable because these compounds are highly reliable and have high hole-transport properties to contribute to a reduction in driving voltage.

Host materials can be selected from known substances as well as from the above host materials. Note that in the case of using a phosphorescent substance as the light-emitting substance, a substance having a triplet level (energy gap between a ground state and a triplet excited state) higher than that of the phosphorescent substance is preferably selected. In the case of using a fluorescent substance as the light-emitting substance, a substance having a bandgap wider than that of the fluorescent substance is preferably selected.

The host material may be formed of one kind of substance or two or more kinds of substances. In the case of using two or more kinds of substances, when one is a hole-transport material and the other is an electron-transport material, the transport properties of the light-emitting layer can be easily adjusted and thus the recombination region can be easily controlled. The ratio of the amount of the material having an electron-transport property to the amount of the material having an electron-transport property may be 1:9 to 9:1. When the two kinds of materials form exciplex, a light-emitting substance can be efficiently excited. In this case, it is further preferable that emission from exciplex overlapping with the absorption band of the light-emitting substance on the longest wavelength side. In addition, the mixture ratio of the two kinds of substances may be changed in the light-emitting layer.

The electron-transport layer 114 contains a material having an electron-transport property. For example, a layer containing a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), BeBq$_2$, or BAlq, or the like can be used. Alternatively, a metal complex having an oxazole-based or thiazole-based ligand, such as ZnPBO or ZnBTZ), or the like can be used. Besides the metal complexes, PBD, OXD-7, TAZ, bathophenanthroline (abbreviation: BPhen), bathocuproine (abbreviation: BCP), or the like can also be used. The substances mentioned here have high electron-transport properties and are mainly ones that have an electron mobility of $10^{-6}$ cm$^2$/Vs or more. Note that any of the above-described host materials having electron-transport properties may be used for the electron-transport layer 114.

The electron-transport layer 114 is not limited to a single layer and may be a stack of two or more layers containing any of the above substances.

Further, a layer for controlling transport of electron carriers may be provided between the electron-transport layer and the light-emitting layer. Specifically, the layer for controlling transport of electron carriers is a layer formed by adding a small amount of substance having a high electron-trap property to the material having a high electron-transport property as described above, so that carrier balance can be adjusted. Such a structure is very effective in suppressing a problem (such as shortening of element lifetime) caused when electrons pass through the light-emitting layer.

In addition, an electron-injection layer 115 may be provided in contact with the second electrode 102 between the electron-transport layer 114 and the second electrode 102. Examples of a material for the electron-injection layer 115 include an alkali metal, an alkaline earth metal, and a compound of these metals, such as lithium fluoride (LiF), cesium fluoride (CsF), or calcium fluoride (CaF$_2$). For example, a layer that is formed using a substance having an electron-transport property and contains an alkali metal, an alkaline earth metal, or a compound thereof can be used. Note that electron injection from the second electrode 102 is efficiently performed with the use of a layer that is formed with a substance having an electron-transport property and contains an alkali metal or an alkaline earth metal as the electron-injection layer 115, which is preferable.

In the case where the light-emitting layer has an electron-transport property higher than a hole-transport property, the electron-transport layer 114 may contain a large amount of halogen elements. When the amount of halogen elements detected by D-SIMS is $1/100$ or less of that of carbon, the electron-transport layer 114 negligibly gives adverse effects to the light-emitting element. In addition, it is preferable that halides be contained so that the amount of halogen elements detected by D-SIMS is $1/10000$ or more of that of carbon detected by the same analysis because cost advantage is enhanced. The electron-injection layer 115 may contain more halogen elements than the electron-transport layer 114 due to the absence of the contact with the light-emitting layer 113.

The second electrode 102 can be formed using a metal, an alloy, or a conductive compound each having a low work function (specifically, 3.8 eV or lower), a mixture of them, or the like. Specific examples of such a cathode material are elements belonging to Groups 1 and 2 of the periodic table, such as alkali metals (e.g., lithium (Li) and cesium (Cs)), magnesium (Mg), calcium (Ca), and strontium (Sr), alloys thereof (e.g., MgAg and AlLi), rare earth metals such as europium (Eu) and ytterbium (Yb), alloys thereof, and the like. However, when the electron-injection layer is provided between the second electrode 102 and the electron-transport layer, for the second electrode 102, any of a variety of conductive materials such as Al, Ag, ITO, or indium oxide-tin oxide containing silicon or silicon oxide can be used regardless of the work function. Films of these electrically conductive materials can be formed by a sputtering method, an inkjet method, a spin coating method, or the like.

Any of various methods can be employed for forming the EL layer 103 regardless of whether it is a dry process or a wet process. For example, a vacuum evaporation method, an inkjet method, a spin coating method or the like may be used. A different formation method may be employed for each electrode or each layer.

The electrode may be formed by a wet process using a sol-gel method, or by a wet process using paste of a metal material. Further alternatively, a dry method such as a sputtering method or a vacuum evaporation method may be used.

In the light-emitting element having the above-described structure, current flows due to a potential difference provided between the first electrode 101 and the second electrode 102, a hole and an electron recombines in the light-emitting layer 113 which includes a substance having a high light-emitting property, and light is emitted. That is, a light-emitting region is formed in the light-emitting layer 113.

In the case where the hole-transport property is higher than the electron-transport property in the light-emitting layer, a carrier-recombination region exists near the interface between the electron transport layer 114 and the light-emitting layer 113 and thus the light-emitting layer tends to be affected by halides in the electron-transport layer 114. As for the concentration of halides of the electron transport layer 114, it is preferable that the amount of halogen elements detected by D-SIMS be less than $1/10000$ (further preferably, less than $1/100000$) of that of carbon detected by the same analysis. Accordingly, the influence on the life time can be more effectively counteracted. Also in this case, the concentration of halogen elements of the electron injection layer 115 may be higher than that of the electron transport layer 114.

Light is extracted outside through one or both of the first electrode 101 and the second electrode 102. Therefore, one or both of the first electrode 101 and the second electrode 102 are light-transmitting electrodes. In the case where only the first electrode 101 is a light-transmitting electrode, light emission is extracted through the first electrode 101. In the case where only the second electrode 102 is a light-transmitting electrode, light emission is extracted through the second electrode 102. In the case where both the first electrode 101 and the second electrode 102 are light-transmitting electrodes, light emission is extracted through the first electrode 101 and the second electrode 102.

The structure of the layers provided between the first electrode 101 and the second electrode 102 is not limited to the aforementioned one. However, it is preferable that a light-emitting region where holes and electrons recombine be positioned away from the first electrode 101 and the second electrode 102 so as to prevent quenching due to the proximity of the light-emitting region and a metal used for electrodes and carrier-injection layers.

Further, in order that transfer of energy from an exciton generated in the light-emitting layer can be suppressed, preferably, the hole-transport layer and the electron-transport layer which are in contact with the light-emitting layer 113, particularly a carrier-transport layer in contact with a side closer to the light-emitting region in the light-emitting layer 113, are formed using a substance having a wider band gap than the material included in the light-emitting layer.

FIG. 2B shows a light-emitting element having different structure from FIG. 2A. One embodiment of a light-emitting element in which a plurality of light-emitting units are stacked (hereinafter, also referred to as a stacked-layer element) will be described with reference to FIG. 2B. This light-emitting element is a light-emitting element including a plurality of light-emitting units between a first electrode and a second electrode. One light-emitting unit has a structure similar to that of the EL layer 103, which is illustrated in FIG. 2A. In other words, the light-emitting element illustrated in FIG. 2A includes a single light-emitting unit; the light-emitting element in this embodiment includes a plurality of light-emitting units.

In FIG. 2B, a first light-emitting unit 511 and a second light-emitting unit 512 are stacked between a first electrode 501 and a second electrode 502, and a charge generation layer 513 is provided between the first light-emitting unit 511 and the second light-emitting unit 512. The first electrode 501 and the second electrode 502 correspond, respectively, to the first electrode 101 and the second electrode 102 illustrated in FIG. 2A, and the materials given in the description for FIG. 2A can be used. Further, the first light-emitting unit 511 and the second light-emitting unit 512 may have the same structure or different structures.

The charge generation layer 513 includes a composite material of an organic compound and a metal oxide. As this composite material of an organic compound and a metal oxide, the composite material that can be used for the hole-injection layer and shown in FIG. 2A can be used. The composite material of the organic compound and the metal oxide can achieve low-voltage driving and low-current driving because of the superior carrier-injection property and carrier-transport property. Note that in the light-emitting unit whose anode side surface is in contact with the charge-generation layer, a hole-transport layer is not necessarily provided because the charge-generation layer can also function as the hole-transport layer.

The charge-generation layer 513 may have a stacked-layer structure of a layer containing the composite material of an organic compound and a metal oxide and a layer containing another material. For example, a stacked-layer structure of a layer containing the composite material of an organic compound and a metal oxide and a layer containing an electron-donating substance and a compound having a high electron-transport property may be formed. Moreover, a layer containing the composite material of an organic compound and a metal oxide may be stacked with a transparent conductive film.

The charge generation layer 513 interposed between the first light-emitting unit 511 and the second light-emitting unit 512 may have any structure as long as electrons can be injected to a light-emitting unit on one side and holes can be injected to a light-emitting unit on the other side when a voltage is applied between the first electrode 501 and the second electrode 502. For example, in FIG. 2B, any layer can be used as the charge generation layer 513 as long as the layer injects electrons into the first light-emitting unit 511 and holes into the second light-emitting unit 512 when a voltage is applied such that the potential of the first electrode is higher than that of the second electrode.

In FIG. 2B, the light-emitting element having two light-emitting units is described; however, one embodiment of the present invention can be similarly applied to a light-emitting element in which three or more light-emitting units are stacked. With a plurality of light-emitting units partitioned by the charge-generation layer between a pair of electrodes as in the light-emitting element according to this embodiment, it is possible to provide a light-emitting element which can emit light with high luminance with the current density kept low and has a long lifetime.

Note that in the structure of FIG. 2B, even if the charge generation layer 513 contains halides, it does not tend to affect characteristics of the element like the first layer of FIG. 2A. In the element including a plurality of light-emitting units shown in FIG. 2B, the light-emitting unit 511 which is in contact with the anode is regarded as the EL layer 103 of FIG. 2A, and the other light-emitting unit 512 and the charge generation layer 513 are regarded, as a whole, as the EL layer 103. That is, in a light-emitting unit which is not directly in contact with the anode, the charge generation layer corresponds to the first layer.

The light-emitting units emit light having different colors from each other, thereby obtaining light emission of a desired color in the whole light-emitting element. For example, in a light-emitting element having two light-emitting units, the first light-emitting unit gives red and green emissions and the second light-emitting unit gives blue emission, so that the light-emitting element can emit white light as the whole element.

The above-described structure can be combined with any of the structures in this embodiment and the other embodiments.

Embodiment 3

In this embodiment, a light-emitting device using the light-emitting element described in Embodiments 1 and 2 will be described.

Figure 3A:
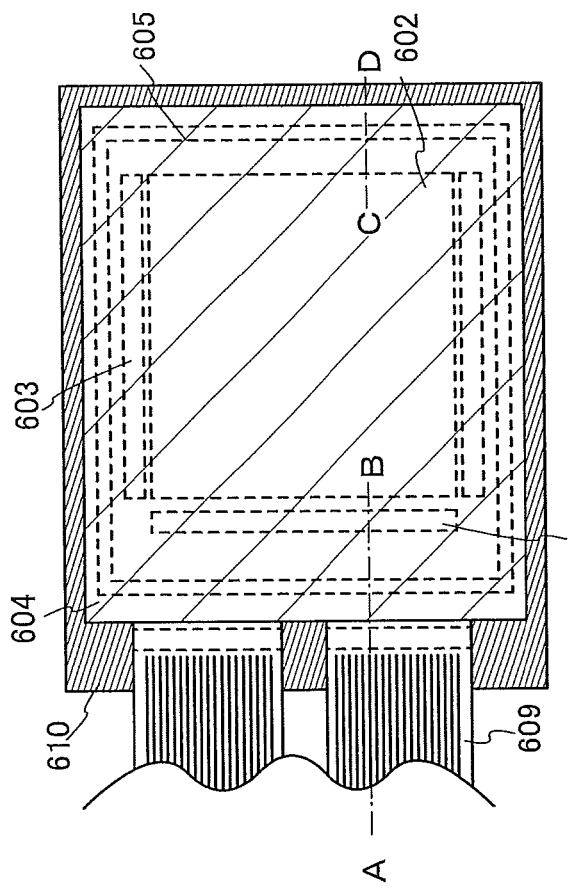
FIGS. 3A and 3B are conceptual diagrams of an active matrix light-emitting device.
Figure 3B:
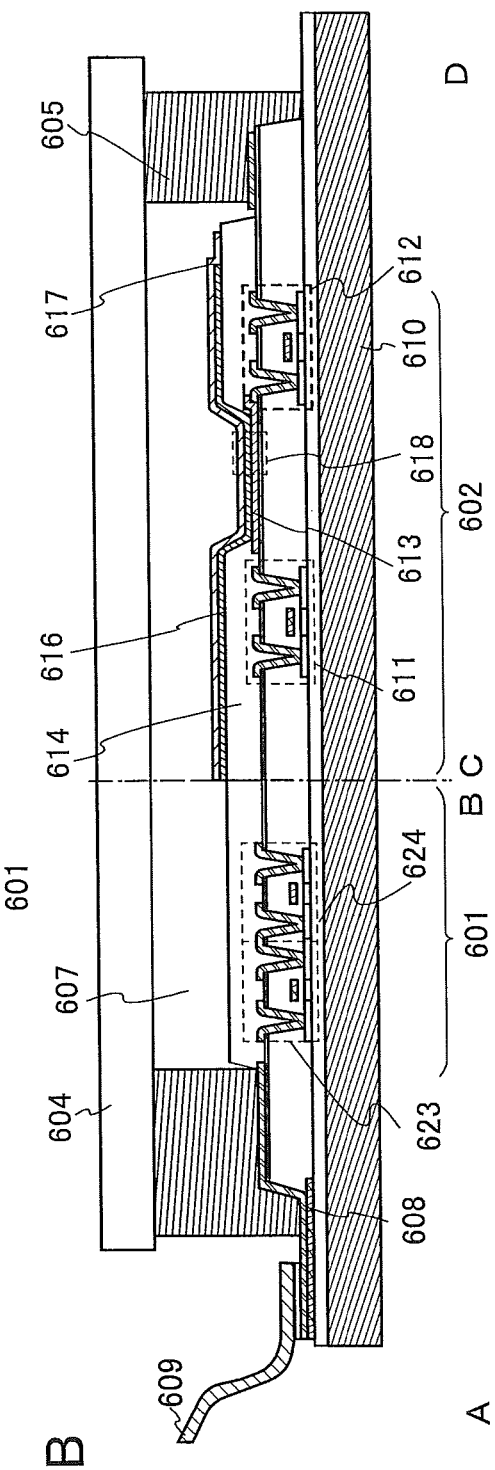

In this embodiment, the light-emitting device using the light-emitting element described in Embodiments 1 and 2 is described with reference to FIGS. 3A and 3B. Note that FIG. 3A is a top view illustrating the light-emitting device and FIG. 3B is a cross-sectional view of FIG. 3A taken along the lines A-B and C-D. The light-emitting device includes a driver circuit portion (source line driver circuit) 601, a pixel portion 602, and a driver circuit portion (gate line driver circuit) 603 which are illustrated with dotted lines. These units control light emission of the light-emitting element. Moreover, a reference numeral 604 denotes a sealing substrate; 605, a sealing material; and 607, a space surrounded by the sealing material 605.

Note that a lead wiring 608 is a wiring for transmitting signals to be input to the source line driver circuit 601 and the gate line driver circuit 603 and for receiving a video signal, a clock signal, a start signal, a reset signal, and the like from an FPC (flexible printed circuit) 609 serving as an external input terminal. Although only the FPC is illustrated here, a printed wiring board (PWB) may be attached to the FPC. The light-emitting device in the present specification includes, in its category, not only the light-emitting device itself but also the light-emitting device provided with the FPC or the PWB.

The cross-sectional structure is described with reference to FIG. 3B. The driver circuit portion and the pixel portion are formed over an element substrate 610. Here, the source line driver circuit 601, which is the driver circuit portion, and one pixel of the pixel portion 602 are shown. A substrate of glass, plastic, or the like can be used as the element substrate.

In the source line driver circuit 601, a CMOS circuit is formed in which an n-channel TFT 623 and a p-channel TFT 624 are combined. Such a driver circuit may be formed by using various circuits such as a CMOS circuit, a PMOS circuit, or an NMOS circuit. Note that there is no particular limitation on the structure of the TFTs 623 and 624, and either a staggered TFT or an inverted staggered TFT can be employed. In addition, crystallinity of a semiconductor used for the TFTs 623 and 624 is not limited: an amorphous semiconductor or a crystalline semiconductor may be used. Although this embodiment illustrates a driver-integrated type where the driver circuit is formed over the substrate, the present invention is not limited to this structure, and the driver circuit may be formed outside the substrate, not over the substrate.

The pixel portion 602 is formed with a plurality of pixels including a switching TFT 611, a current controlling TFT 612, and a first electrode 613 connected electrically with a drain of the current controlling TFT 612. An insulator 614 is formed to cover the end portions of the first electrode 613. Here, the insulator 614 is formed using a positive type photosensitive acrylic resin film.

In order to improve the coverage, the insulator 614 is formed to have a curved surface with curvature at its upper or lower end portion. For example, in the case of using positive photosensitive acrylic for the insulator 614, the upper end portion of the insulator 614 preferably has a curved surface with a radius of curvature of 0.2 to 3 µm. The insulator 614 can be formed using either a negative type photosensitive resin or a positive type photosensitive resin.

Over the first electrode 613, an EL layer 616 and a second electrode 617 are formed. As a material used for the first electrode 613 which functions as an anode, a material for the first electrode 101 of Embodiment 2 can be used. For example, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance, favorable ohmic contact, and a function as an anode.

The EL layer 616 is formed by various methods such as an evaporation method using an evaporation mask, an inkjet method, a spin coating method, or the like. The EL layer 616 has a structure similar to that described in Embodiments 1 and 2. Further, the EL layer 616 may be formed using another material such as a low molecular weight compound or a polymer compound (a category of the high molecular weight compound includes an oligomer and a dendrimer).

As a material used for the second electrode 617 which is formed over the EL layer 616 and serves as a cathode, the materials for the second electrode 102 of Embodiment 2 can be used. In the case where light generated in the EL layer 616 passes through the second electrode 617, the second electrode 617 is preferably formed using a stack of a thin metal film and a transparent conductive film (such as ITO, indium oxide containing zinc oxide at 2 wt % to 20 wt %, indium tin oxide containing silicon, zinc oxide (ZnO), or the like).

Note that the light-emitting element is formed by the first electrode 613, the EL layer 616, and the second electrode 617. The light-emitting element has the structure described in Embodiment 1 or 2. In the light-emitting device of this embodiment, the pixel portion, which includes a plurality of light-emitting elements, may include both the light-emitting element described in Embodiment 1 or 2 and a light-emitting element having a different structure.

Further, a light-emitting element 618 is provided in the space 607 surrounded by the element substrate 610, the sealing substrate 604, and the sealing material 605 by fixing the sealing substrate 604 and the element substrate 610 using the sealing material 605. The space 607 may be filled with filler, and may be filled with an inert gas (such as nitrogen or argon), the sealing material 605, or the like. It is preferable that the sealing substrate be provided with a recessed portion and a drying agent be provided in the recessed portion, in which case deterioration due to influence of moisture can be suppressed.

An epoxy-based resin or glass frit is preferably used for the sealing material 605. A material used for these is desirably a material which does not transmit moisture or oxygen as possible. As a material for the sealing substrate 604, a plastic substrate made of FRP (Fiberglass-Reinforced Plastics), PVF (polyvinyl fluoride), a polyester, an acrylic resin, or the like can be used besides a glass substrate or a quartz substrate.

As described above, the light-emitting device which uses the light-emitting element described in Embodiment 1 or 2 can be obtained. Hence, it is possible to manufacture a light-emitting device at low cost without influencing durability.

FIGS. 4A and 4B illustrates examples of light-emitting devices in which full color display is achieved by forming a light-emitting element exhibiting white light emission and providing a coloring layer (a color filter) and the like. In FIG. 4A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting elements, a partition wall 1025, an EL layer 1028, a second electrode 1029 of the light-emitting elements, a sealing substrate 1031, a sealant 1032, and the like are illustrated.

In FIG. 4A, coloring layers (a red layer 1034R, a green layer 1034G and a blue layer 1034B) are provided on a transparent base material 1033. Further, a black layer (a black matrix) 1035 may be additionally provided. The transparent base material 1033 provided with the coloring layers and the black layer is positioned and fixed to the substrate 1001. Note that the coloring layers and the black layer are covered with an overcoat layer 1036. In FIG. 4A, light emitted from part of the light-emitting layer does not pass through the coloring layers, while light emitted from the other part of the light-emitting layer passes through the coloring layers. Since light which does not pass through the coloring layers is white and light which passes through any one of the coloring layers is red, blue, or green, a full color image can be displayed using pixels of the four colors.

FIG. 4B illustrates an example in which the coloring layers (the red layer 1034R, the green layer 1034G, and the blue layer 1034B) are formed between the gate insulating film 1003 and the first interlayer insulating film 1020. As in the structure, the coloring layers may be provided between the substrate 1001 and the sealing substrate 1031.

Figure 5:
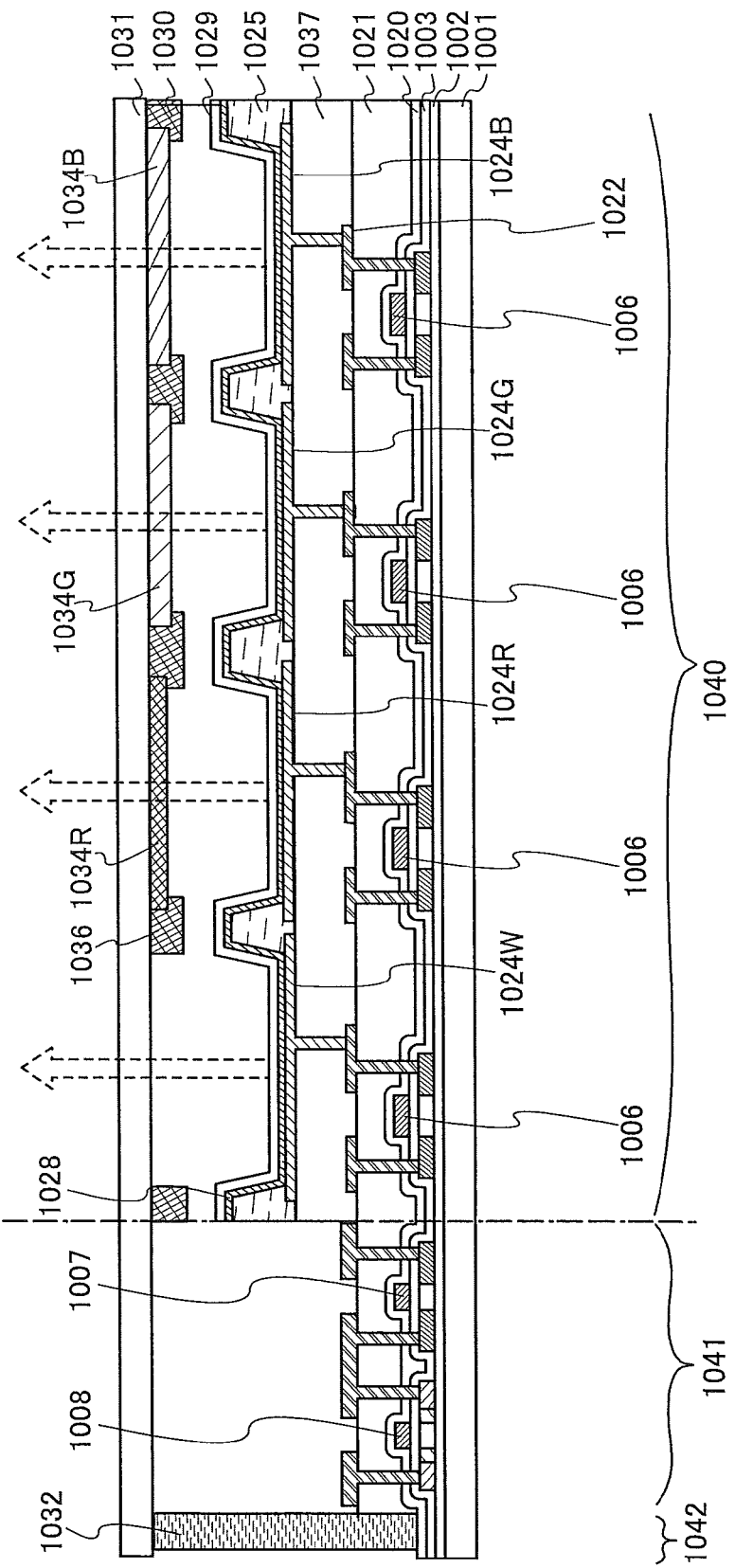
FIG. 5 is a conceptual diagram of an active matrix light-emitting device.

The above-described light-emitting device is a light-emitting device having a structure in which light is extracted from the substrate 1001 side where the TFTs are formed (a bottom emission structure), but may be a light-emitting device having a structure in which light is extracted from the sealing substrate 1031 side (a top emission structure). FIG. 5 is a cross-sectional view of a light-emitting device having a top emission structure. In this case, a substrate which does not transmit light can be used as the substrate 1001. The light-emitting device has a third interlayer insulating film 1037 covering a connection electrode 1022 which connects the TFT with the first electrodes.

The first electrodes 1024W, 1024R, 1024, and 1024B of the light-emitting elements each serve as an anode here, but may serve as a cathode. Further, in the case of a light-emitting device having a top emission structure as illustrated in FIG. 5, the first electrodes are preferably reflective electrodes. The EL layer 1028 is formed to have a structure similar to the structure of the EL layer 103, which is described in Embodiment 1 or 2, with which white light emission can be obtained.

In the case of a top emission structure as illustrated in FIG. 5, sealing can be performed with the sealing substrate 1031 on which the coloring layers (the red layer 1034R, the green layer 1034G, and the blue layer 1034B) are provided. The sealing substrate 1031 may be provided with the black layer 1035 which is positioned between pixels. Note that a light-transmitting substrate is used as the sealing substrate 1031.

Further, although an example in which full color display is performed using four colors of red, green, blue, and white is shown here, there is no particular limitation and full color display using three colors of red, green, and blue may be performed.

The light-emitting device in this embodiment is fabricated using the light-emitting element described in Embodiment 1 or 2 and thus, it is possible to manufacture a light-emitting device at low cost without influencing durability.

Figure 6A:
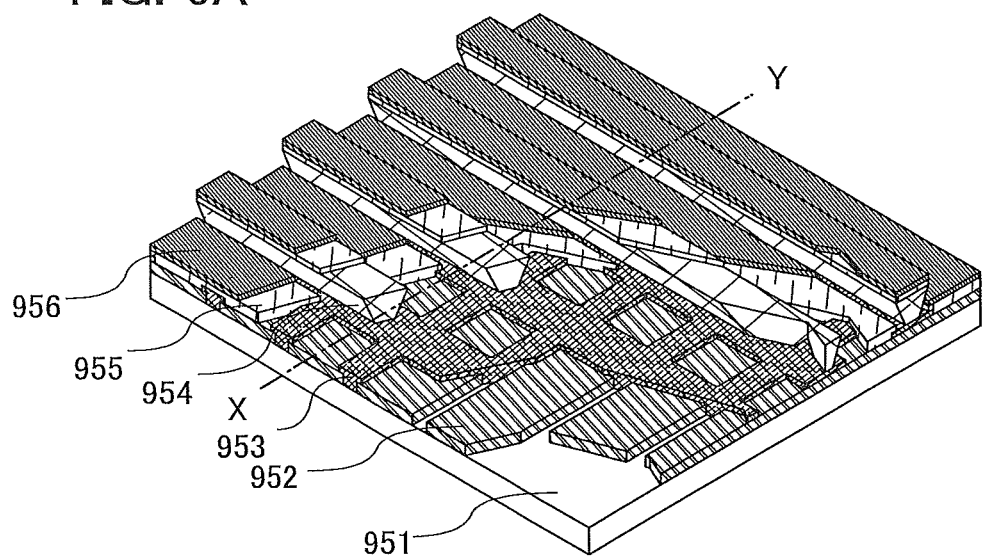
FIGS. 6A and 6B are conceptual diagrams of a passive matrix light-emitting device.
Figure 6B:
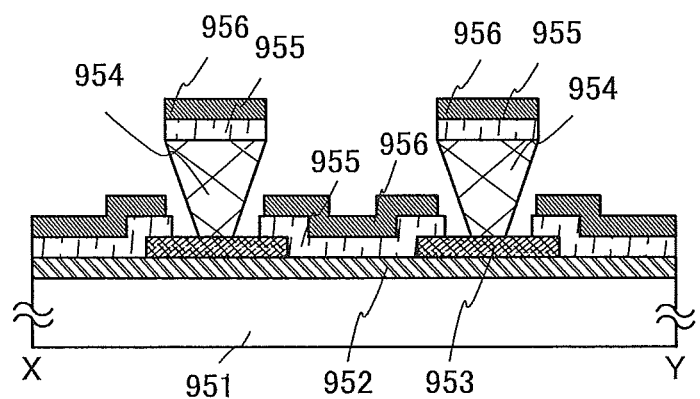

An active matrix light-emitting device is thus described above, and a passive matrix light-emitting device is described below. FIG. 6A shows a perspective view of a passive matrix light-emitting device manufactured by application of the present invention. FIG. 6A is a perspective view of the light-emitting device, and FIG. 6B is a cross-sectional view taken along a line X-Y of FIG. 6A. In FIGS. 6A and 6B, over a substrate 951, an EL layer 955 is provided between an electrode 952 and an electrode 956. Since many minute light-emitting elements arranged in a matrix are provided, the device can be used as a display device by controlling each of the light-emitting elements. An edge portion of the electrode 952 is covered with an insulating layer 953. A partition layer 954 is provided over the insulating layer 953. The sidewalls of the partition layer 954 are aslope such that the distance between both sidewalls is gradually narrowed toward the surface of the substrate. That is, a cross section in a short side of the partition layer 954 is a trapezoidal shape, and a lower side (the side in contact with the insulating layer 953) is shorter than an upper side (the side not in contact with the insulating layer 953). By providing the partition layer 954 in this manner, defects of the light-emitting element due to cross-talk can be prevented. The passive matrix light-emitting device can be also manufactured at low cost without influencing durability by applying the light-emitting element described in Embodiment 1 or 2.

This embodiment can be freely combined with any of other embodiments.

Embodiment 4

Figure 7A:
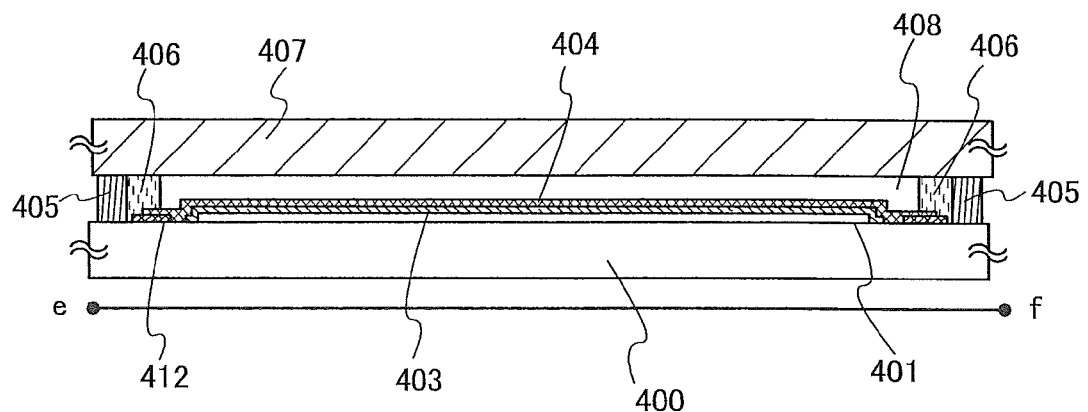
FIGS. 7A and 7B are conceptual diagrams of a lighting device.
Figure 7B:
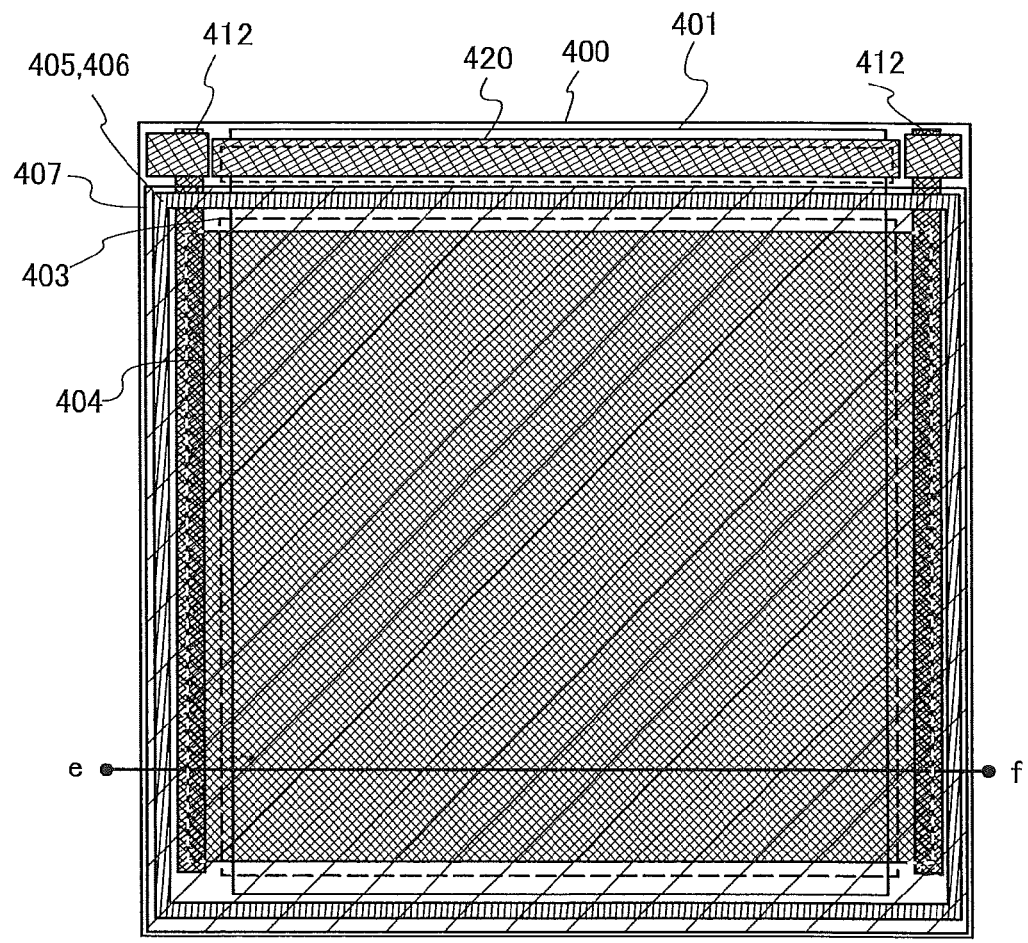

In this embodiment, an example in which the light-emitting element described in Embodiment 1 or 2 is used for a lighting device will be described with reference to FIGS. 7A and 7B. FIG. 7B is a top view of the lighting device, and FIG. 7A is a cross-sectional view taken along line e-f in FIG. 7B.

In the lighting device in this embodiment, a first electrode 401 is formed over a substrate 400 which is a support and has a light-transmitting property. The first electrode 401 corresponds to the first electrode 101 in Embodiment 1. When light is extracted through the first electrode 401 side, the first electrode 401 is formed using a material having a light-transmitting property.

A pad 412 for applying voltage to a second electrode 404 is provided over the substrate 400.

An EL layer 403 is formed over the first electrode 401. The structure of the EL layer 403 corresponds to, for example, the structure of the EL layer 103 in Embodiment 1, or the structure in which the light-emitting units 511 and 512 and the charge-generation layer 513 are combined. For these structures, the description in Embodiment 1 can be referred to.

The second electrode 404 is formed to cover the EL layer 403. The second electrode 404 corresponds to the second electrode 102 in Embodiment 1. The second electrode 404 is formed using a material having high reflectance when light is extracted through the first electrode 401 side. The second electrode 404 is connected to the pad 412, whereby voltage is applied thereto.

As described above, the lighting device described in this embodiment includes a light-emitting element including the first electrode 401, the EL layer 403, and the second electrode 404. Since the light-emitting element can be inexpensively manufactured at low cost, the lighting device according to one embodiment of the present invention can be inexpensively manufactured without influencing durability.

The light-emitting element having the above structure is fixed to a sealing substrate 407 with sealing materials 405 and 406 and sealing is performed, whereby the lighting device is completed. It is possible to use only either the sealing material 405 or the sealing material 406. The inner sealing material 406 (not shown in FIG. 7B) can be mixed with a desiccant which enables moisture to be adsorbed, increasing reliability.

Parts of the pad 412 and the first electrode 401 are extended to the outside of the sealing materials 405 and 406 to serve as external input terminals. An IC chip 420 mounted with a converter or the like may be provided over the external input terminals.

As described above, since the lighting device described in this embodiment includes the light-emitting element described in Embodiment 1 or 2 as an EL element, the lighting device can be manufactured at low cost without influencing durability.

Embodiment 5

In this embodiment, examples of electronic devices each including the light-emitting element described in Embodiment 1 or 2 will be described. Since the light-emitting device described in Embodiment 1 or 2 can be manufactured at low cost without influencing durability, an electronic device can be provided at low cost without influencing durability.

Examples of the electronic devices to which the above light-emitting element is applied include television devices (also referred to as TV or television receivers), monitors for computers and the like, cameras such as digital cameras and digital video cameras, digital photo frames, cellular phones (also referred to as mobile phones or mobile phone devices), portable game machines, portable information terminals, audio playback devices, large game machines such as pin-ball machines, and the like. Specific examples of these electronic devices are described below.

FIG. 8A illustrates an example of a television set. In the television device, a display portion 7103 is incorporated in a housing 7101. In addition, here, the housing 7101 is supported by a stand 7105. Images can be displayed on the display portion 7103, and in the light-emitting portion 7103, the light-emitting elements described in Embodiments 1 and 2 are arranged in a matrix. The light-emitting element can be manufactured at low cost without influencing durability. Thus, the television set having the display portion 7103 which is formed using the light-emitting element can be manufactured at low cost without influencing durability.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

FIG. 8B1 illustrates a computer, which includes a main body 7201, a housing 7202, a display portion 7203, a keyboard 7204, an external connection port 7205, a pointing device 7206, and the like. Note that this computer is manufactured by using light-emitting elements arranged in a matrix in the display portion 7203, which are the same as that described in Embodiment 2 or 3. The computer illustrated in FIG. 8B1 may have a structure illustrated in FIG. 8B2. A computer illustrated in FIG. 8B2 is provided with a second display portion 7210 instead of the keyboard 7204 and the pointing device 7206. The second display portion 7210 has a touch screen, and input can be performed by operation of display for input on the second display portion 7210 with a finger or a dedicated pen. The second display portion 7210 can also display images other than the display for input. The display portion 7203 may also have a touch screen. Connecting the two screens with a hinge can prevent troubles; for example, the screens can be prevented from being cracked or broken while the computer is being stored or carried. Note that this computer is manufactured using the light-emitting elements each of which is described in Embodiments 1 and 2 and which are arranged in a matrix in the display portion 7203. Therefore, this computer having the display portion 7203 which includes the light-emitting element can be manufactured at low cost without influencing durability.

FIG. 8C illustrates a portable game machine, which includes two housings, a housing 7301 and a housing 7302, which are connected with a joint portion 7303 so that the portable game machine can be opened or folded. The housing 7301 incorporates a display portion 7304 including the light-emitting elements described in Embodiments 1 and 2 and arranged in a matrix, and the housing 7302 incorporates a display portion 7305. In addition, the portable game machine illustrated in FIG. 8C includes a speaker portion 7306, a recording medium insertion portion 7307, an LED lamp 7308, an input means (an operation key 7309, a connection terminal 7310, a sensor 7311 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 7312), and the like. Needless to say, the structure of the portable game machine is not limited to the above as long as the display portion which includes the light-emitting elements described in Embodiments 1 and 2 and arranged in a matrix is used as at least either the display portion 7304 or the display portion 7305, or both, and the structure can include other accessories as appropriate. The portable game machine illustrated in FIG. 8C has a function of reading out a program or data stored in a storage medium to display it on the display portion, and a function of sharing information with another portable game machine by wireless communication. The portable game machine in FIG. 8C can have a variety of functions without limitation to the above functions. Since the portable game machine including the display portion 7304 includes the light-emitting element described in Embodiment 1 or 2 as the display portion 7304, the portable game machine can be manufactured at low cost without influencing durability.

FIG. 8D illustrates an example of a mobile phone. The mobile phone is provided with a display portion 7402 incorporated in a housing 7401, operation buttons 7403, an external connection port 7404, a speaker 7405, a microphone 7406, and the like. Note that the mobile phone 7400 has the display portion 7402 including the light-emitting elements described in Embodiments 1 and 2 and arranged in a matrix. Thus, the mobile phone can be manufactured at low cost without influencing durability.

When the display portion 7402 of the mobile phone illustrated in FIG. 8D is touched with a finger or the like, data can be input into the mobile phone. In this case, operations such as making a call and creating e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on a screen can be inputted. In that case, it is preferable to display a keyboard or number buttons on almost all the area of the screen of the display portion 7402.

When a detection device which includes a sensor for detecting inclination, such as a gyroscope or an acceleration sensor, is provided inside the cellular phone, the direction of the cellular phone (whether the cellular phone is placed horizontally or vertically for a landscape mode or a portrait mode) is determined so that display on the screen of the display portion 7402 can be automatically switched.

The screen modes are switched by touching the display portion 7402 or operating the operation buttons 7403 of the housing 7401. Alternatively, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

FIG. 9 illustrates an example of a liquid crystal display device using the light-emitting element described in Embodiments 1 and 2 for a backlight. The liquid crystal display device illustrated in FIG. 9 includes a housing 901, a liquid crystal layer 902, a backlight unit 903, and a housing 904. The liquid crystal layer 902 is connected to a driver IC 905. The light-emitting element described in Embodiments 1 and 2 is used in the backlight unit 903, to which current is supplied through a terminal 906.

The light-emitting element described in Embodiments 1 and 2 is used for the backlight of the liquid crystal display device. By using the light-emitting element described in Embodiments 1 and 2, a planar lighting device can be fabricated at low cost without influencing durability, and the area can be increased. Thus, the area of the backlight can be increased, and the area of the liquid crystal display device can also be increased. Furthermore, the light-emitting device using the light-emitting element described in Embodiment 2 is thin; accordingly, the display device can also be thinner.

Figure 10:
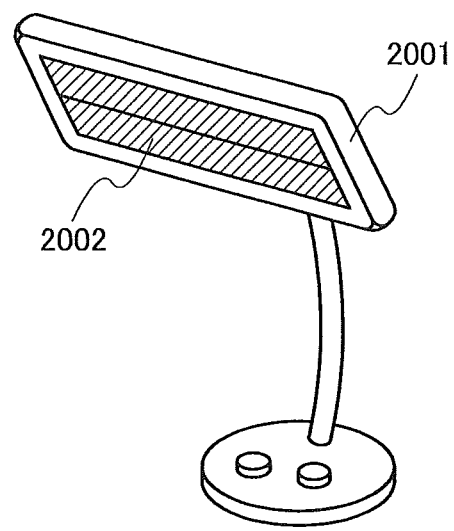
FIG. 10 illustrates a lighting device.

FIG. 10 illustrates an example in which the light-emitting element described in Embodiments 1 and 2 is used for a table lamp which is a lighting device. The table lamp illustrated in FIG. 10 includes a housing 2001 and a light source 2002, and the lighting device described in Embodiment 4 is used for the light source 2002.

Figure 11:
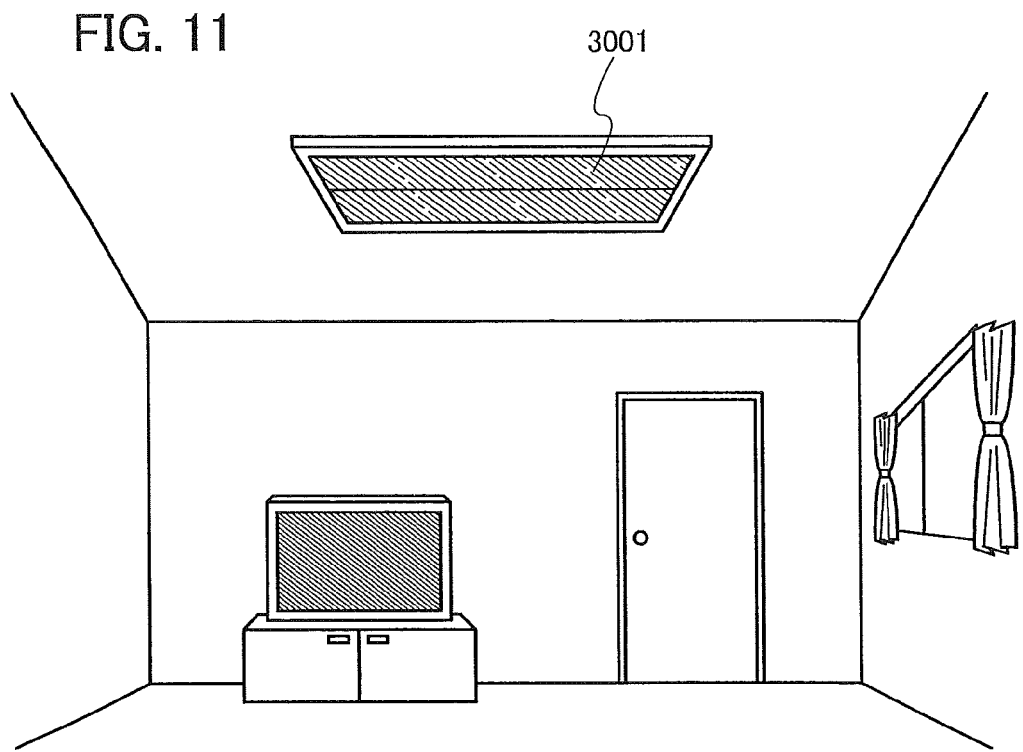
FIG. 11 illustrates a lighting device.

FIG. 11 illustrates an example in which the light-emitting element described in Embodiment 1 and 2 is used for an indoor lighting device 3001. Since the light-emitting element described in Embodiments 1 and 2 can be manufactured at low cost without influencing durability, the lighting device can be supplied at low cost without influencing durability. Further, since the light-emitting element described in Embodiments 1 and 2 can have a large area, the light-emitting element can be used for a large-area lighting device. Furthermore, since the light-emitting element described in Embodiments 1 and 2 is thin, the light-emitting element can be used for a lighting device having a reduced thickness.

Figure 12:
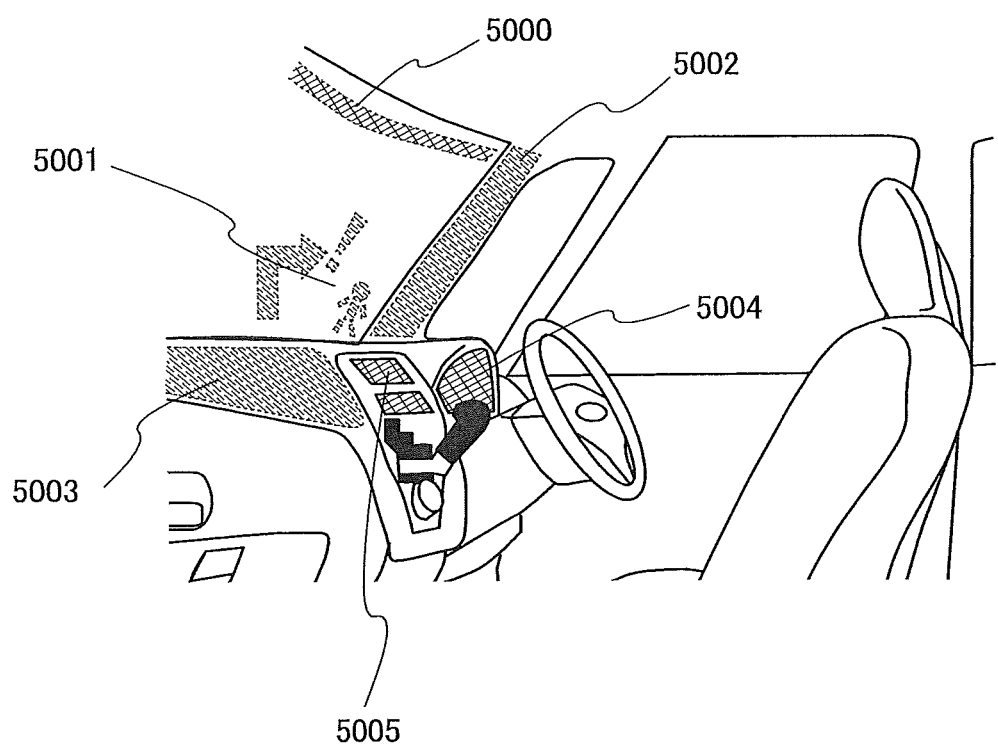
FIG. 12 illustrates in-car display devices and lighting devices.

The light-emitting element described in Embodiments 1 and 2 can also be used for an automobile windshield or an automobile dashboard. FIG. 12 illustrates one mode in which the light-emitting elements described in Embodiment 2 are used for an automobile windshield and an automobile dashboard.

The display regions 5000 and 5001 are display devices which are provided in the automobile windshield and in which light-emitting elements each of which is described in Embodiments 1 and 2 are incorporated. The light-emitting element described in Embodiments 1 and 2 can be formed into what is called a see-through display device, through which the opposite side can be seen, by including a first electrode and a second electrode formed of electrodes having light-transmitting properties. Such see-through display devices can be provided even in the windshield on the car, without hindering the vision. In addition, for example, when a transistor for driving the light-emitting element is provided, a transistor having a light-transmitting property, such as an organic transistor using an organic semiconductor material or a transistor using an oxide semiconductor, is preferably used.

A display device incorporating the light-emitting element described in Embodiments 1 and 2 is provided in the display region 5002 in a pillar portion. The display region 5002 can compensate for the view hindered by the pillar portion by showing an image taken by an imaging unit provided in the car body. Similarly, the display region 5003 provided in the dashboard can compensate for the view hindered by the car body by showing an image taken by an imaging unit provided in the outside of the car body, which leads to elimination of blind areas and enhancement of safety. Showing an image so as to compensate for the area which a driver cannot see, makes it possible for the driver to confirm safety easily and comfortably.

The display region 5004 and the display region 5005 can provide a variety of kinds of information such as navigation data, a speedometer, a tachometer, a mileage, a fuel meter, a gearshift indicator, and air-condition setting. The content or layout of the display can be changed freely by a user as appropriate. Further, such information can also be shown by the display regions 5000 to 5003. Note that the display regions 5000 to 5005 can also be used as lighting devices.

Since the light-emitting element described in Embodiments 1 and 2 can be manufactured at low cost without influencing durability, the display devices provided in the display regions 5000 to 5005 can be suitably used as an in-vehicle light-emitting device and an in-vehicle lighting device.

Figure 13A:
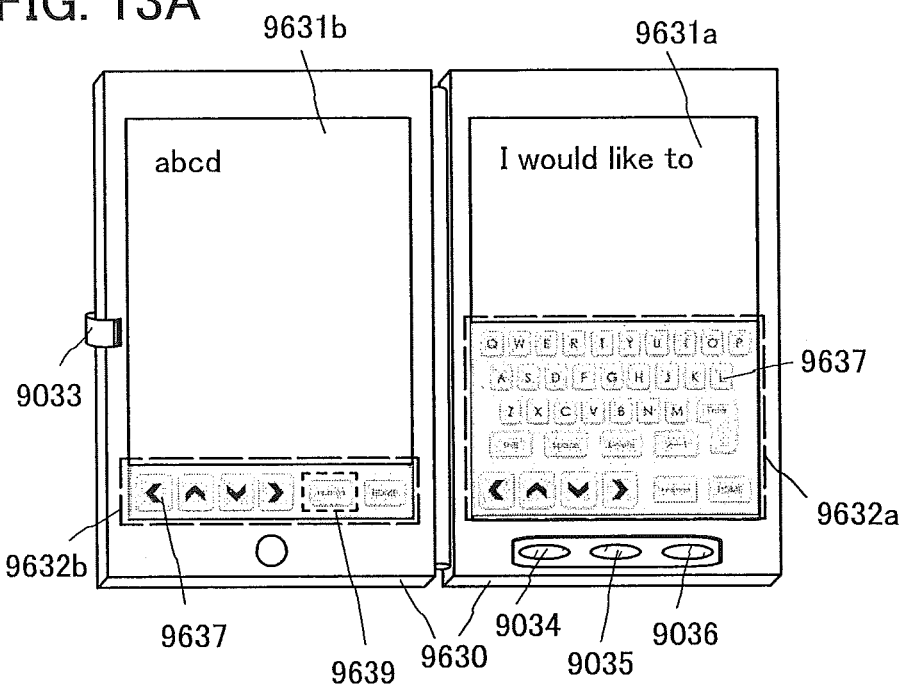
FIGS. 13A and 13B illustrate an electronic device.
Figure 13B:
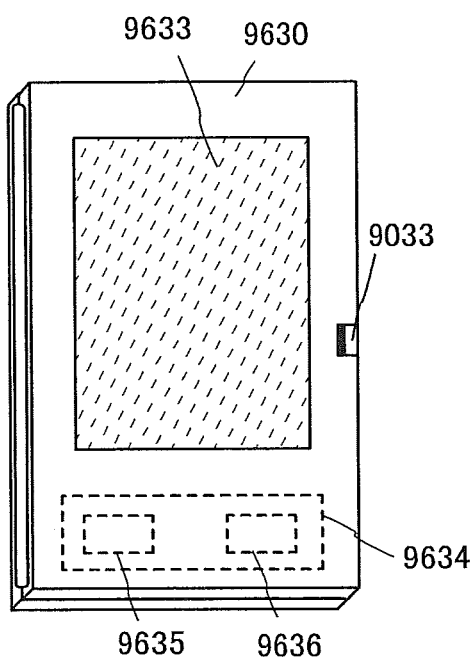

FIGS. 13A and 13B illustrate an example of a foldable tablet terminal. In FIG. 13A, the tablet terminal is opened, and includes a housing 9630, a display portion 9631a, a display portion 9631b, a switch 9034 for switching display modes, a power switch 9035, a switch 9036 for switching to power-saving mode, and a fastener 9033. Note that in the tablet, one or both of the display portion 9631a and the display portion 9631b is/are formed using a light-emitting device which includes the light-emitting element described in Embodiments 1 and 2.

Part of the display portion 9631a can be a touch panel region 9632a and data can be input when a displayed operation key 9037 is touched. Although half of the area of the display portion 9631a has only a display function and the other half of the area has a touch panel function, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

Like the display portion 9631a, part of the display portion 9631b can be a touchscreen region 9632b. A switching button 9639 for showing/hiding a keyboard of the touch panel is touched with a finger, a stylus, or the like, so that keyboard buttons can be displayed on the display portion 9631b.

Touch input can be performed in the touchscreen region 9632a and the touchscreen region 9632b at the same time.

The switch 9034 for switching display modes can switch display orientation (e.g., between landscape mode and portrait mode) and select a display mode (switch between monochrome display and color display), for example. With the switch 9036 for switching to power-saving mode, the luminance of display can be optimized in accordance with the amount of external light at the time when the tablet is in use, which is detected with an optical sensor incorporated in the tablet. The tablet may include another detection device such as a sensor for detecting orientation (e.g., a gyroscope or an acceleration sensor) in addition to the optical sensor.

Although the display portion 9631a and the display portion 9631b have the same display area in FIG. 13A, one embodiment of the present invention is not limited to this example, and they may be different in areas or display quality. For example, one of them may be a display panel that can display higher-definition images than the other.

FIG. 13B illustrates the tablet terminal which is folded. The tablet terminal in this embodiment includes the housing 9630, a solar cell 9633, a charge and discharge control circuit 9634, a battery 9635, and a DCDC converter 9636. Note that in FIG. 13B, a structure including a battery 9635 and a DCDC converter 9636 is illustrated as an example of the charge/discharge control circuit 9634.

Since the tablet can be folded in two, the housing 9630 can be closed when the tablet is not in use. Thus, the display portions 9631a and 9631b can be protected, thereby providing a tablet with high endurance and high reliability for long-term use.

In addition, the tablet terminal illustrated in FIGS. 13A and 13B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633, which is attached on the surface of the tablet terminal, supplies electric power to a touch panel, a display portion, an image signal processor, and the like. Note that the solar cell 9633 is preferably provided on one or two surfaces of the housing 9630, in which case the battery 9635 can be charged efficiently.

Figure 13C:
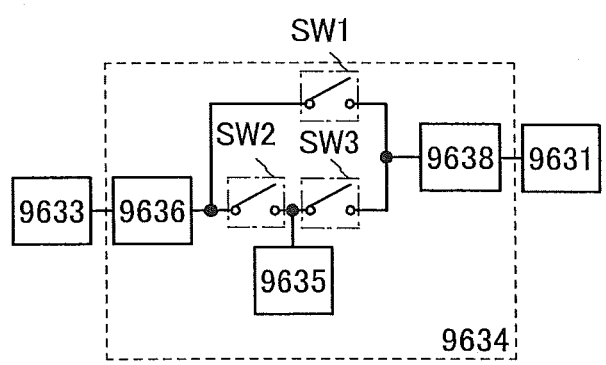
FIG. 13C illustrates a block diagram of a circuit of the electronic device.
Figure 14:
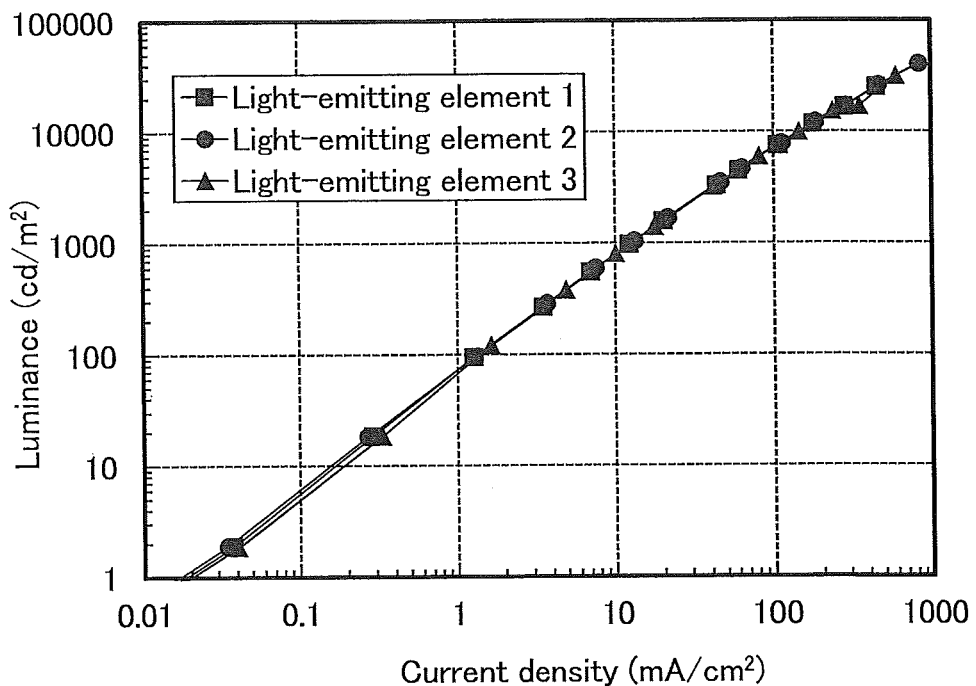
FIG. 14 is a graph showing current density versus luminance characteristics of light-emitting elements 1 to 3.
Figure 15:
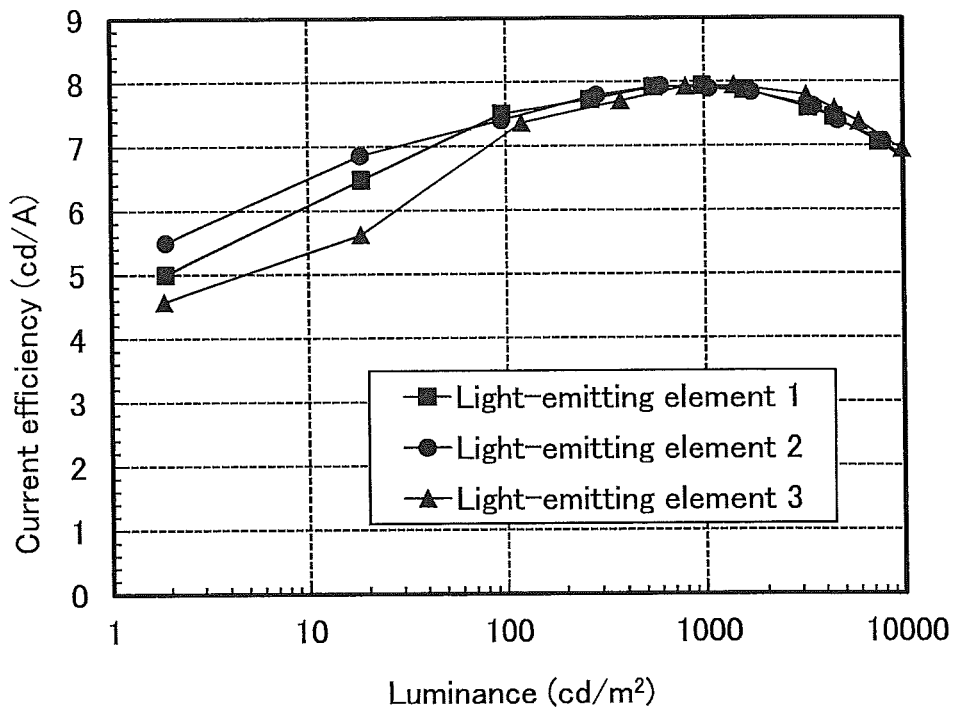
FIG. 15 is a graph showing luminance versus current efficiency characteristics of the light-emitting elements 1 to 3.
Figure 16:
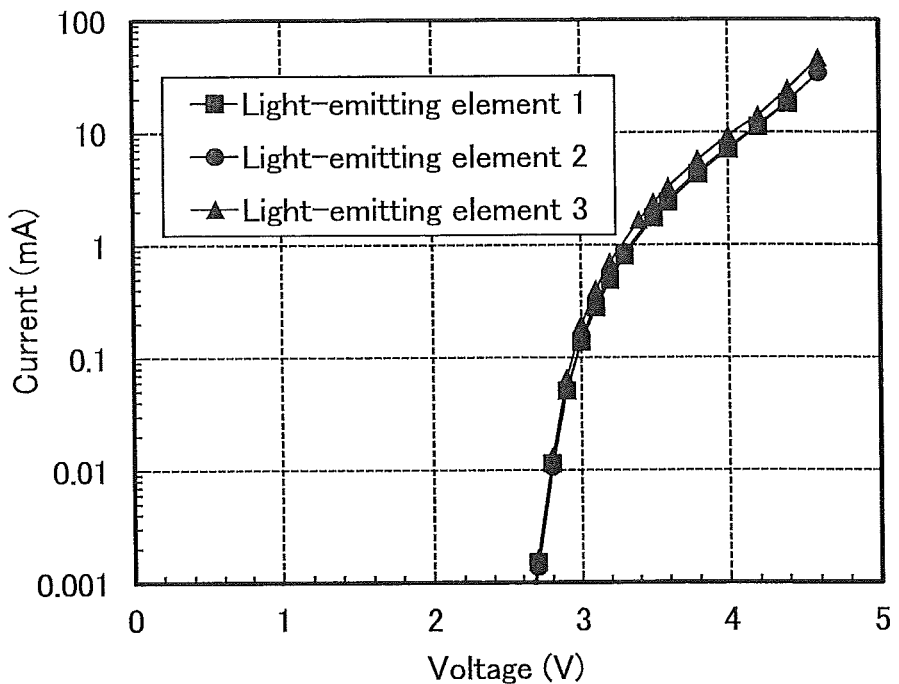
FIG. 16 is a graph showing voltage-current characteristics of the light-emitting elements 1 to 3.
Figure 17:
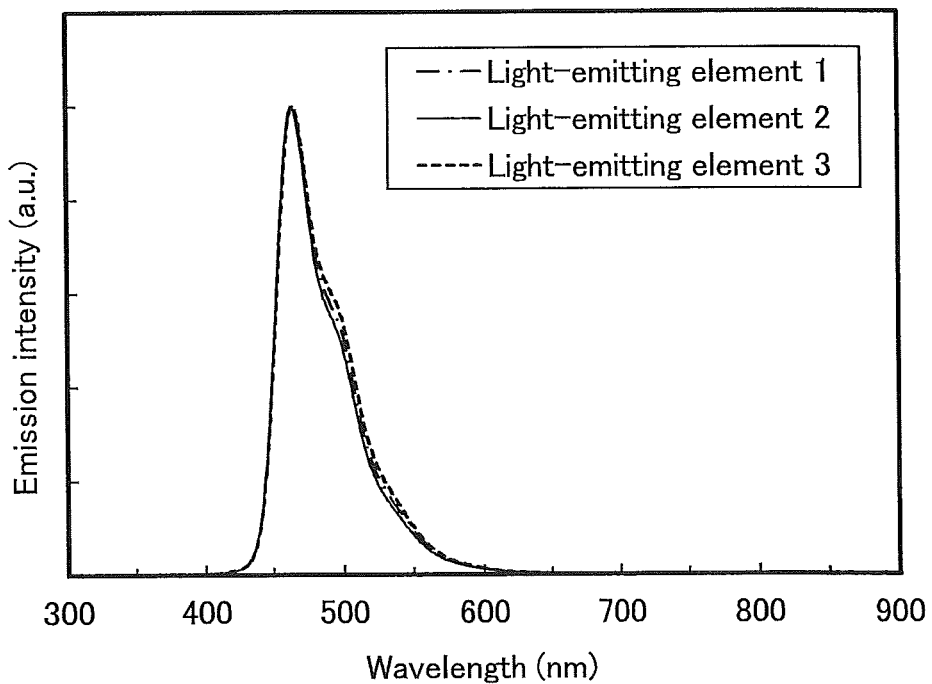
FIG. 17 is a graph showing emission spectra of the light-emitting elements 1 to 3.
Figure 18:
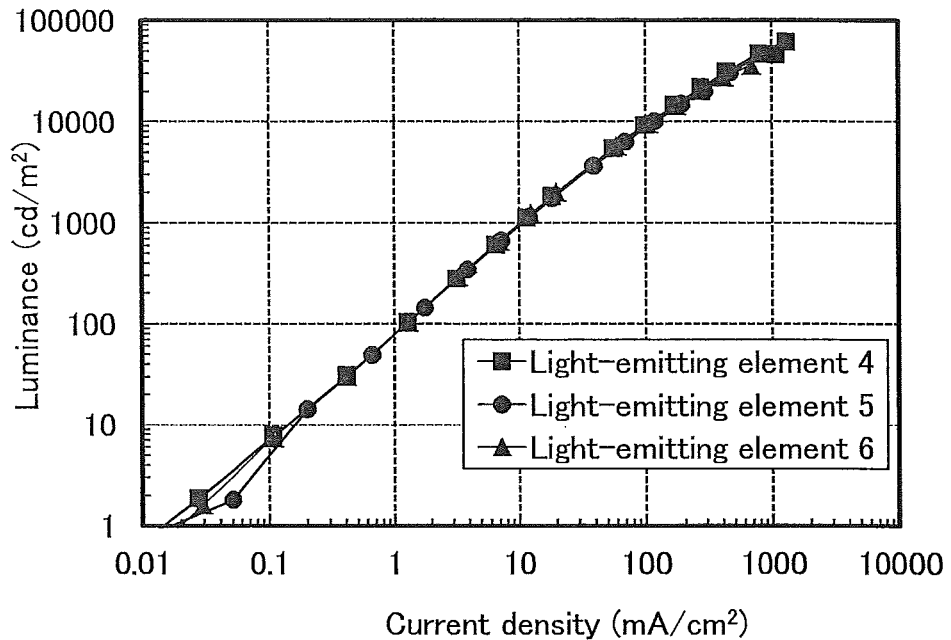
FIG. 18 is a graph showing current density versus luminance characteristics of light-emitting elements 4 to 6.
Figure 19:
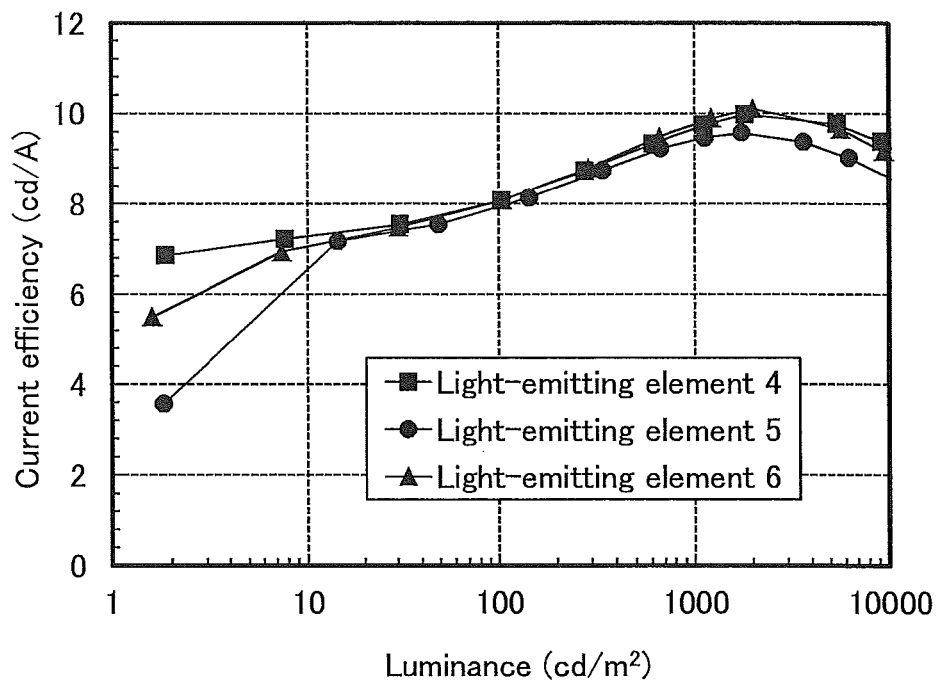
FIG. 19 is a graph showing luminance versus current efficiency characteristics of the light-emitting elements 4 to 6.
Figure 20:
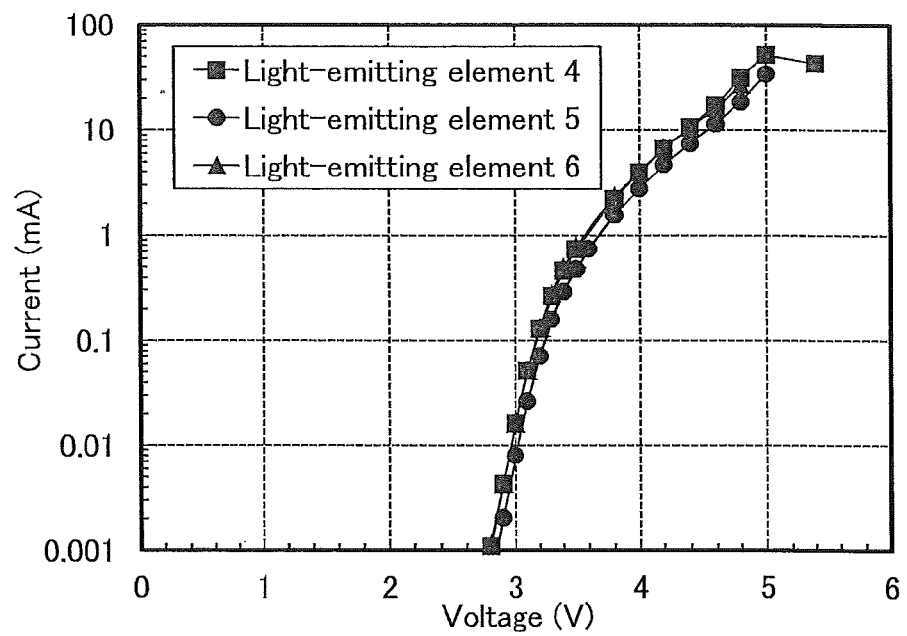
FIG. 20 is a graph showing voltage-current characteristics of the light-emitting elements 4 to 6.
Figure 21:
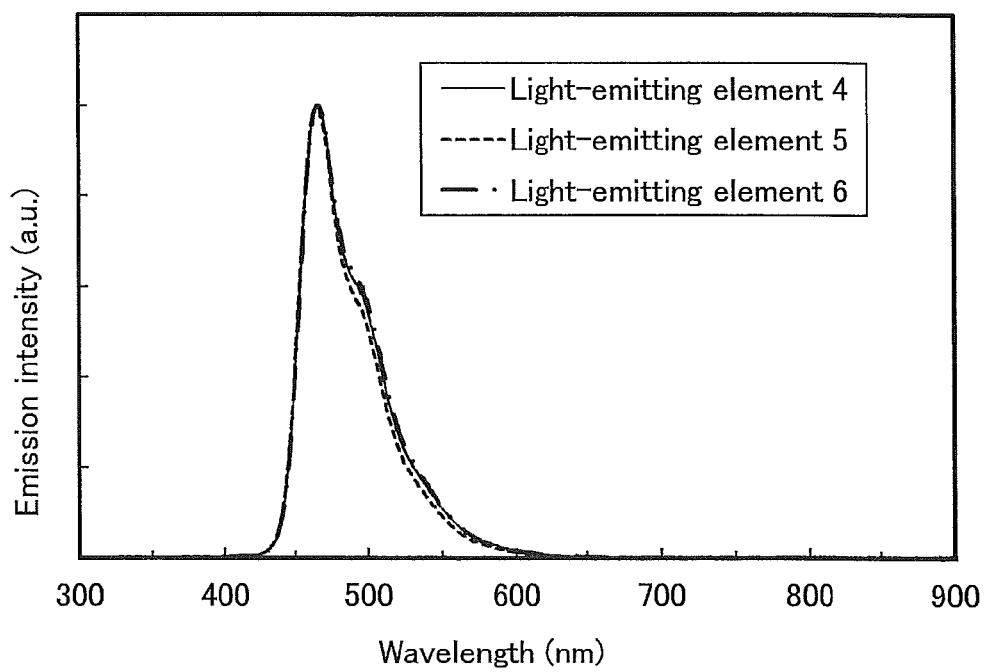
FIG. 21 is a graph showing emission spectra of the light-emitting elements 4 to 6.

The structure and the operation of the charge/discharge control circuit 9634 illustrated in FIG. 13B are described with reference to a block diagram in FIG. 13C. FIG. 13C illustrates the solar cell 9633, the battery 9635, the DCDC converter 9636, a converter 9638, switches SW1 to SW3, and the display portion 9631. The battery 9635, the DCDC converter 9636, the converter 9638, and the switches SW1 to SW3 correspond to the charge/discharge control circuit 9634 in FIG. 13B.

First, an example of operation in the case where power is generated by the solar cell 9633 using external light is described. The voltage of power generated by the solar battery is raised or lowered by the DCDC converter 9636 so that the power has a voltage for charging the battery 9635. Then, when power supplied from the battery 9635 charged by the solar cell 9633 is used for the operation of the display portion 9631, the switch SW1 is turned on and the voltage of the power is raised or lowered by the converter 9638 so as to be voltage needed for the display portion 9631. In addition, when display on the display portion 9631 is not performed, the switch SW1 is turned off and a switch SW2 is turned on so that charge of the battery 9635 is performed.

Although the solar cell 9633 is described as an example of a power generation means, the power generation means is not particularly limited, and the battery 9635 may be charged by another power generation means such as a piezoelectric element or a thermoelectric conversion element (Peltier element). The battery 9635 may be charged by a non-contact power transmission module which is capable of charging by transmitting and receiving power by wireless (without contact), or another charge means used in combination, and the power generation means is not necessarily provided.

One embodiment of the present invention is not limited to the tablet terminal having the shape illustrated in FIGS. 13A to 13C as long as the display portion 9631 is included.

Note that the structure described in this embodiment can be combined with any of the structures described in Embodiments 1 to 4 as appropriate.

Example 1

In this example, light-emitting elements (light-emitting elements 2 and 3) of one embodiment of the present invention and comparative light-emitting elements (light-emitting elements 1, 4, 5, and 6) will be described. Chemical formulae of materials used in this example are shown below. Note that each of the light-emitting elements 1 to 6 has the structure of the light-emitting element described in Embodiment 1.

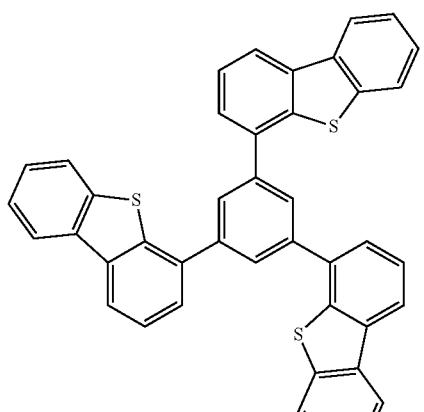

(i) DBT3P-II

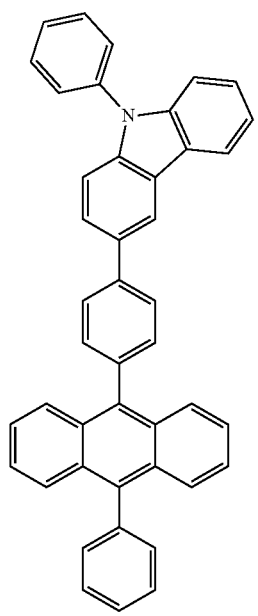

(ii) PCzPA

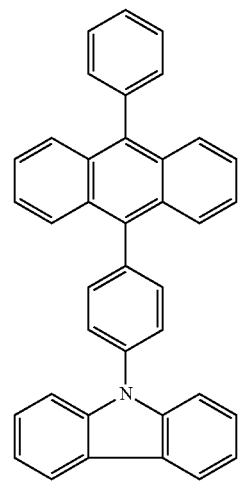

(iii) CzPA

-continued

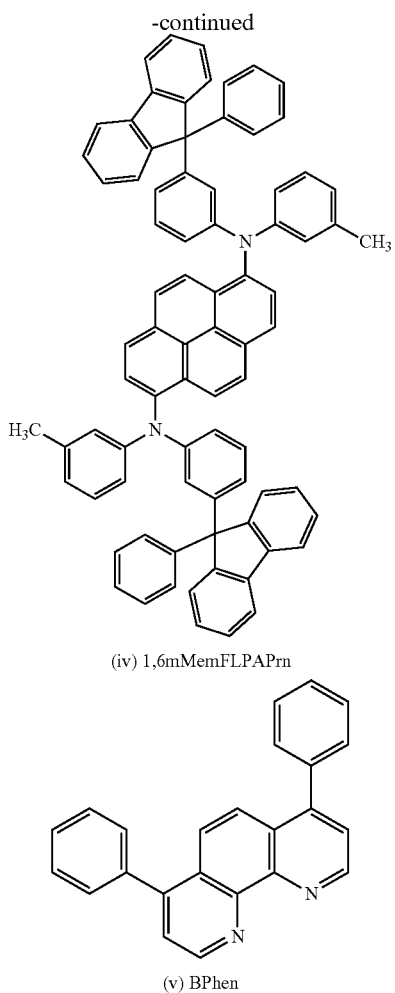

(iv) 1,6mMemFLPAPrn (v) BPhen

The following shows a method of manufacturing the light-emitting elements 1 to 6.

(Method for Manufacturing Light-Emitting Element 1)

First, a film of indium tin oxide containing silicon oxide (ITSO) was formed over a glass substrate by a sputtering method, whereby the first electrode 101 was formed. The thickness was 110 nm and the electrode area was 2 mm×2 mm. Here, the first electrode 101 functions as an anode of the light-emitting element.

Next, as pretreatment for forming the light-emitting element over the substrate, a surface of the substrate was washed with water, baked at 200° C. for one hour, and subjected to UV ozone treatment for 370 seconds.

Then, the substrate was transferred into a vacuum evaporation apparatus whose pressure was reduced to about $10^{-4}$ Pa, vacuum baking at 170° C. for 30 minutes was performed in a heating chamber of the vacuum evaporation apparatus, and then the substrate was cooled down for about 30 minutes.

Then, the substrate provided with the first electrode 101 was fixed to a substrate holder provided in the vacuum evaporation apparatus so that the side on which the first electrode 101 was formed faced downward. The pressure in the vacuum evaporation apparatus was reduced to about $10^{-4}$ Pa. After that, over the first electrode 101, DBT3P-II represented by Structural Formula (i) and molybdenum(VI) oxide were deposited by co-evaporation, so that the first layer 111 (hole-injection layer) was formed. The thickness was 50 nm, and the weight ratio of DBT3P-II to molybdenum oxide was adjusted to 4:2 (=DBT3P-II:molybdenum oxide). Note that the co-evaporation method refers to an evaporation method in which evaporation from a plurality of evaporation sources is carried out at the same time in one treatment chamber. Note that DBT3P-II used here had been highly purified such that the concentration of the bromides which are impurities is below the detection limit of the UV detector of an UPLC apparatus and further below the detection limit of the TOF-MS. Note that detection of the bromides by the TOF-MS was carried out at m/z of 522, 704, and 784 which correspond to the bromides that could be formed in a synthetic process or sublimation purification of DBT3P-II.

Next, over the first layer 111 (hole-injection layer), a film of 9-phenyl-3-[4-(10-phenyl-9-anthryl)phenyl]-9H-carbazole (abbreviation: PCzPA) represented by Structural Formula (ii) was formed to a thickness of 10 nm to form a second layer 112 (hole-transport layer). Since PCzPA was highly purified one in which the amount of the bromides was below the detection limit of the UV detector and TOF-MS of the UPLC apparatus, both of the first layer 111 and the second layer 112 of the light-emitting element 1 contain negligible amount of bromides. Note that detection of the bromides by the TOF-MS was carried out at m/z of 412 and 651 which corresponds to the bromides that could be formed in a synthetic process or sublimation purification for PCzPA.

Next, CzPA represented by the above structural formula (iii) and 1,6mMemFLPAPm represented by the above structural formula (iv) were co-evaporated over the second layer 112 (hole-transport layer) to a thickness of 30 nm so that the weight ratio was 1:0.05 (=CzPA: 1,6mMemFLPAPrn), thereby forming the light-emitting layer 113.

After that, on the light-emitting layer 113, CzPA was deposited to a thickness of 10 nm, and BPhen represented by Structural Formula (v) was deposited to a thickness of 15 nm to form the electron-transport layer 114.

After the formation of the electron-transport layer 114, LiF was deposited by evaporation to a thickness of 1 nm, so that the electron-injection layer 115 was formed. At last, aluminum was deposited by evaporation to a thickness of 200 nm to form the second electrode 102 functioning as a cathode. Thus, the light-emitting element 1 of this example was fabricated.

Note that, in the above evaporation process, evaporation was all performed by a resistance heating method.

(Method for Manufacturing Light-emitting Element 2)

In the light-emitting element 2, as the DBT3P-II of the first layer 111 of the light-emitting element 1, DBT3P-II in which bromides cannot be detected by the UV detector (less than 0.1%) but can be detected by TOF-MS (over the detection limit of TOF-MS) was used. The other components were formed in a manner similar to those of the light-emitting element 1.

(Method for Manufacturing Light-Emitting Element 3)

In the light-emitting element 3, as the DBT3P-II of the first layer 111 of the light-emitting element 1, DBT3P-II in which the concentration of the bromides was about 4% was used. The concentration of the bromides was obtained by the peak areas of the chromatogram obtained by the UV detector. The other components were formed in a manner similar to those of the light-emitting element 1.

(Method for Manufacturing Light-Emitting Element 4)

In the light-emitting element 4, instead of the PCzPA of the second layer 112 of the light-emitting element 1, DBT3P-II in which the concentration of the bromides was below the detection limit of the TOF-MS was used. In other words, the light-emitting element 4 has a structure in which both of the DBT3P-II in the first layer 111 and the DBT3P-II in the second layer 112 are highly purified.

(Method for Manufacturing Light-Emitting Element 5)

In the light-emitting element 5, instead of the DBT3P-II of the first layer 111 of the light-emitting element 1, and instead of the PCzPA of the second layer 112 of the light-emitting element 1, DBT3P-II in which the bromides cannot be detected by the UV detector but can be detected by the TOF-MS detector was used. In other words, the light-emitting element 5 has a structure in which the concentration of the bromides are higher than the detection limit of TOF-MS but lower than 0.1% in both of the DBT3P-II in the first layer 111 and the DBT3P-II in the second layer 112.

(Method for Manufacturing Light-Emitting Element 6)

In the light-emitting element 6, instead of the DBT3P-II of the first layer 111 of the light-emitting element 1, and instead of the PCzPA of the second layer 112, DBT3P-II in which the concentration of the bromides, which was obtained by the peak areas of the chromatogram obtained by the UV detector, was about 4% was used. In other words, the light-emitting element 6 has a structure in which the concentrations of the bromides is about 4% in both of the DBT3P-II in the first layer 111 and the DBT3P-II in the second layer 112.

DBT3P-II used here was prepared by the Suzuki-Miyaura coupling of tribromobenzene with about 3 equivalents of dibenzothiophene-4-boronic acid (scheme (f-1)).

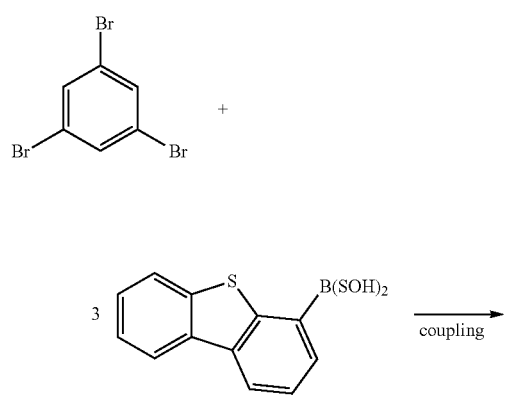

(f-1)

DBT3P-II, an intermediate thereof, and a by-product thereof have low solubility in organic solvent and are difficult to purify.

A compound (101) and a compound (102) in the scheme (f-1) are a by-product and an intermediate, respectively, generated by the coupling. When a mixture of these compound was subjected to sublimation purification, a compound (103) and a compound (104) which were supposed to be formed in such a manner that one or two bromine atoms were migrated from the compound (102) were newly detected. Further, the content of the compound (102) was reduced and the content of the compound (101) was increased. From these results, it was confirmed that the bromides which are the impurities in DBT3P-II used here are formed by the reaction paths illustrated in scheme (f-2).

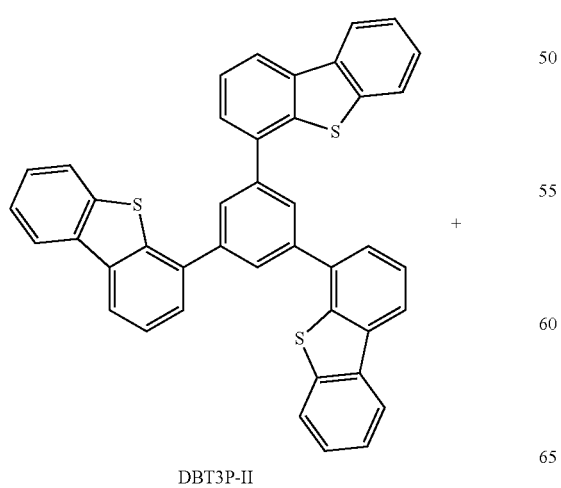

(f-2)

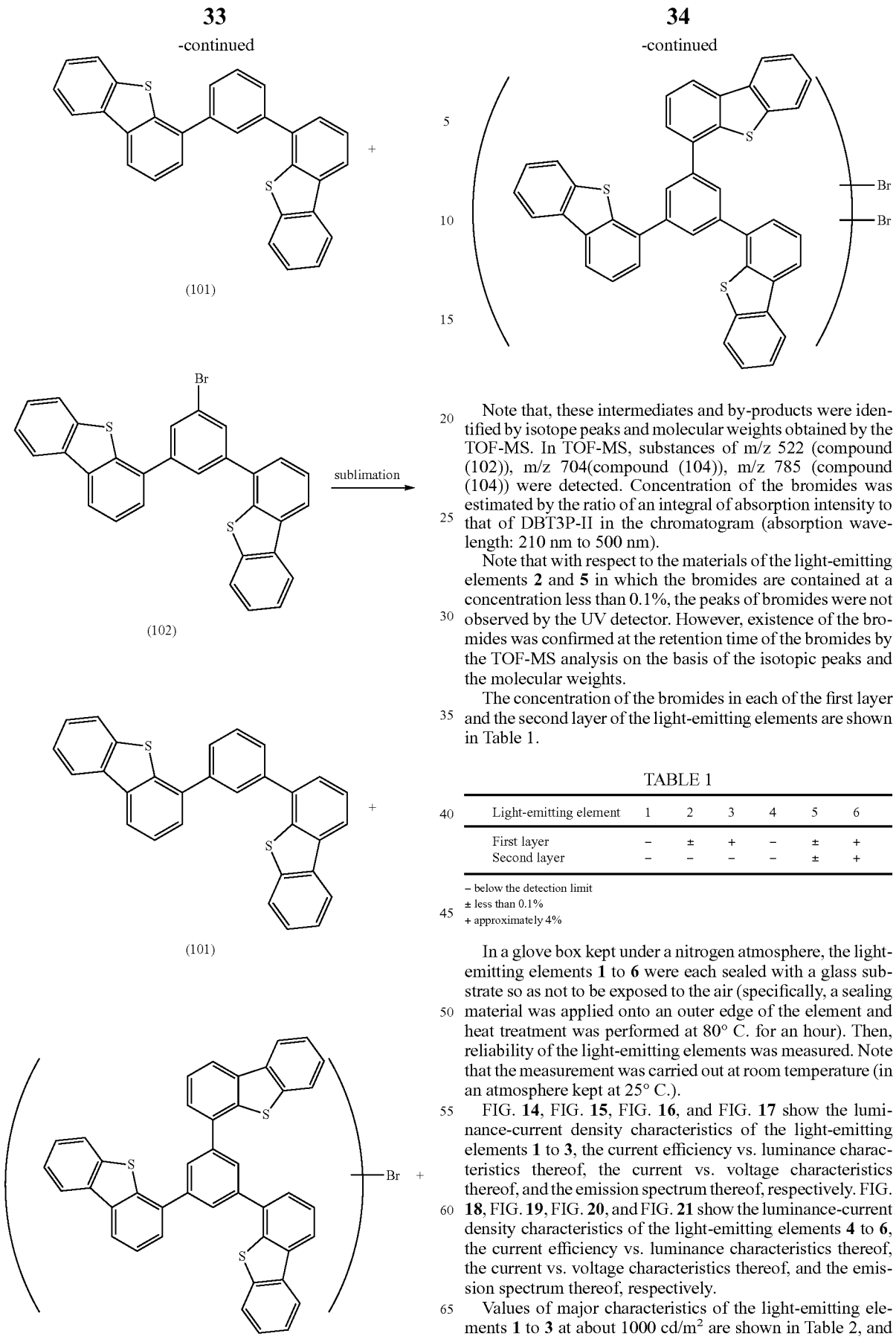

Note that, these intermediates and by-products were identified by isotope peaks and molecular weights obtained by the TOF-MS. In TOF-MS, substances of m/z 522 (compound (102)), m/z 704(compound (104)), m/z 785 (compound (104)) were detected. Concentration of the bromides was estimated by the ratio of an integral of absorption intensity to that of DBT3P-II in the chromatogram (absorption wavelength: 210 nm to 500 nm).

Note that with respect to the materials of the light-emitting elements 2 and 5 in which the bromides are contained at a concentration less than 0.1%, the peaks of bromides were not observed by the UV detector. However, existence of the bromides was confirmed at the retention time of the bromides by the TOF-MS analysis on the basis of the isotopic peaks and the molecular weights.

The concentration of the bromides in each of the first layer and the second layer of the light-emitting elements are shown in Table 1.

TABLE 1

| Light-emitting element | 1 | 2 | 3 | 4 | 5 | 6 |
|---|---|---|---|---|---|---|
| First layer | − | ± | + | − | ± | + |
| Second layer | − | − | − | − | ± | + |

− below the detection limit
± less than 0.1%
+ approximately 4%

In a glove box kept under a nitrogen atmosphere, the light-emitting elements 1 to 6 were each sealed with a glass substrate so as not to be exposed to the air (specifically, a sealing material was applied onto an outer edge of the element and heat treatment was performed at 80° C. for an hour). Then, reliability of the light-emitting elements was measured. Note that the measurement was carried out at room temperature (in an atmosphere kept at 25° C.).

FIG. 14, FIG. 15, FIG. 16, and FIG. 17 show the luminance-current density characteristics of the light-emitting elements 1 to 3, the current efficiency vs. luminance characteristics thereof, the current vs. voltage characteristics thereof, and the emission spectrum thereof, respectively. FIG. 18, FIG. 19, FIG. 20, and FIG. 21 show the luminance-current density characteristics of the light-emitting elements 4 to 6, the current efficiency vs. luminance characteristics thereof, the current vs. voltage characteristics thereof, and the emission spectrum thereof, respectively.

Values of major characteristics of the light-emitting elements 1 to 3 at about 1000 cd/m² are shown in Table 2, and Table 3 shows those of the light-emitting elements 4 to 6.

TABLE 2

| Light-emitting element | Voltage (V) | Current (mA) | Current density (mA/cm²) | Chromaticity x | Chromaticity y | Current efficiency (cd/A) | Power efficiency (lm/W) | External quantum efficiency (%) |
|---|---|---|---|---|---|---|---|---|
| 1 | 3.2 | 0.49 | 12.3 | 0.15 | 0.20 | 7.9 | 7.8 | 5.9 |
| 2 | 3.2 | 0.53 | 13.3 | 0.15 | 0.19 | 7.9 | 7.8 | 6.0 |
| 3 | 3.1 | 0.40 | 10.1 | 0.15 | 0.20 | 7.9 | 8.0 | 5.6 |

TABLE 3

| Light-emitting element | Voltage (V) | Current (mA) | Current density (mA/cm²) | Chromaticity x | Chromaticity y | Current efficiency (cd/A) | Power efficiency (lm/W) | External quantum efficiency (%) |
|---|---|---|---|---|---|---|---|---|
| 4 | 3.4 | 0.46 | 11.4 | 0.15 | 0.21 | 9.7 | 9.0 | 6.7 |
| 5 | 3.5 | 0.48 | 12.0 | 0.15 | 0.20 | 9.5 | 8.5 | 6.9 |
| 6 | 3.4 | 0.49 | 12.3 | 0.15 | 0.22 | 9.9 | 9.1 | 6.8 |

According to these results, there is not a significant difference among initial characteristics of the light-emitting elements.

Figure 22:
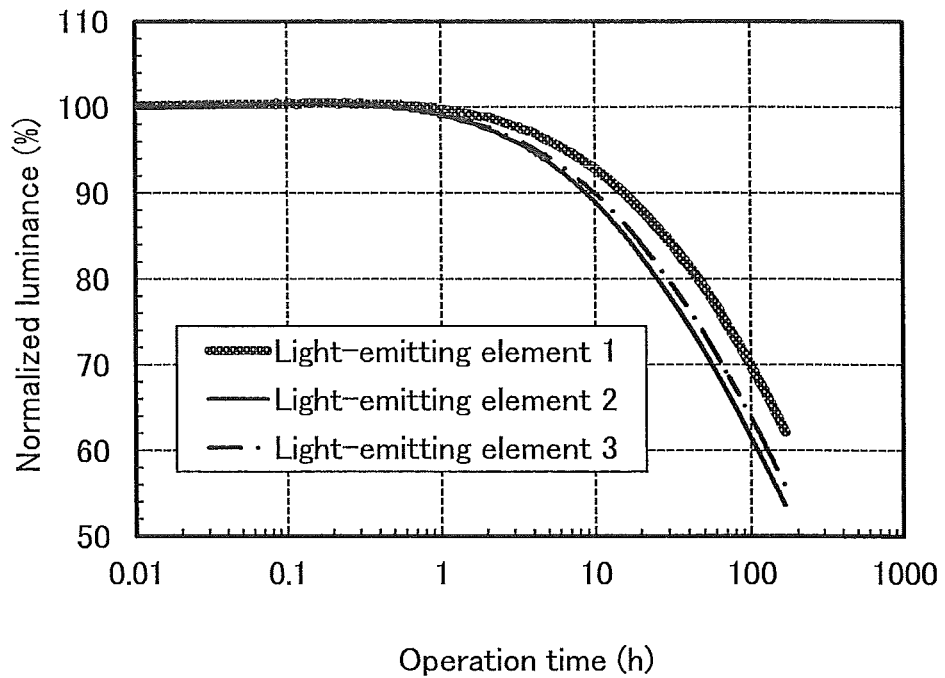
FIG. 22 is a graph showing time dependence of normalized luminance of the light-emitting elements 1 to 3.
Figure 23:
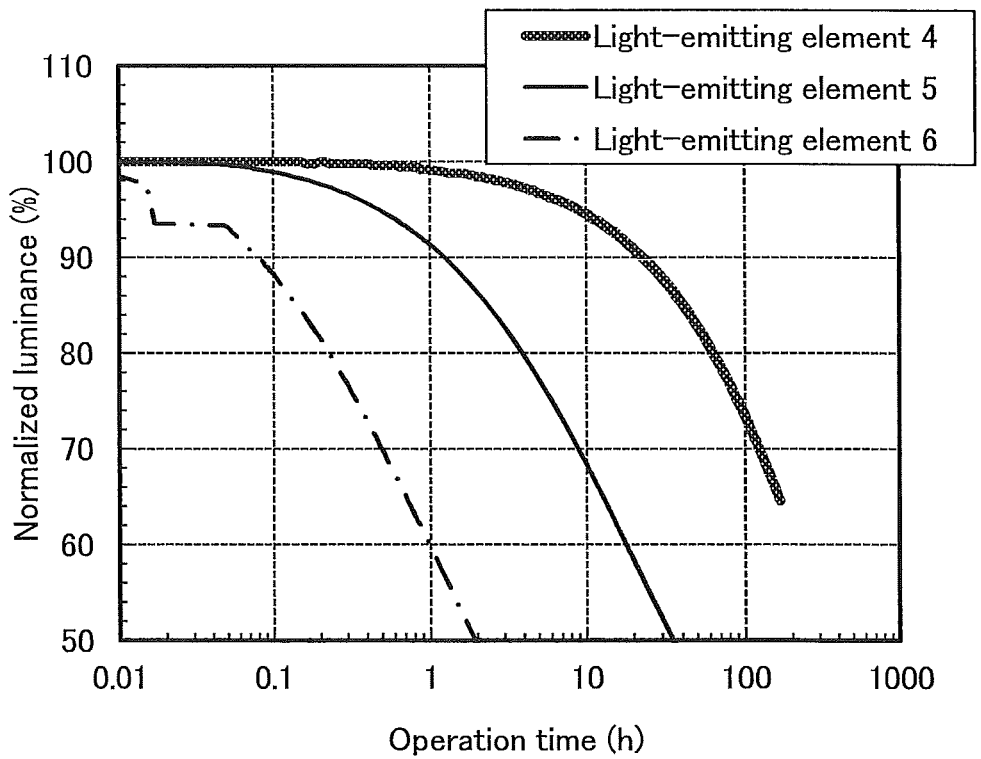
FIG. 23 is a graph showing time dependence of normalized luminance of the light-emitting elements 4 to 6.

FIG. 22 shows change in luminance of the light-emitting elements 1 to 3 with respect to driving time in a condition where the initial luminance is 5000 cd/m² and a current value is constant. FIG. 23 shows change in luminance of the light-emitting elements 4 to 6 with respect to driving time in a condition where the initial luminance is 5000 cd/m² and a current value is constant. It is found from FIG. 22 that the light-emitting elements 1 to 3 have nearly the same characteristics and the influence of the bromides contained in the first layer is suppressed. On the other hand, it is found from FIG. 23 that degradation of luminance accelerates with an increase in the amount of the bromides contained in the second layer and there is 100 times or more difference in durability between the light-emitting elements 4 and 6. As described above, the influence of halides (halogen elements) contained in the second layer is large, and it is preferable that the concentration of halogen element in the second layer be low. On the other hand, it is found that the light-emitting element is insensitive to the concentration of halogen element in the first layer. Thus, a compound containing relatively large amount of halides can be used for the first layer, allowing the formation of a light-emitting element which is advantageous in terms of cost because such a compound is inexpensive.

Figure 24:
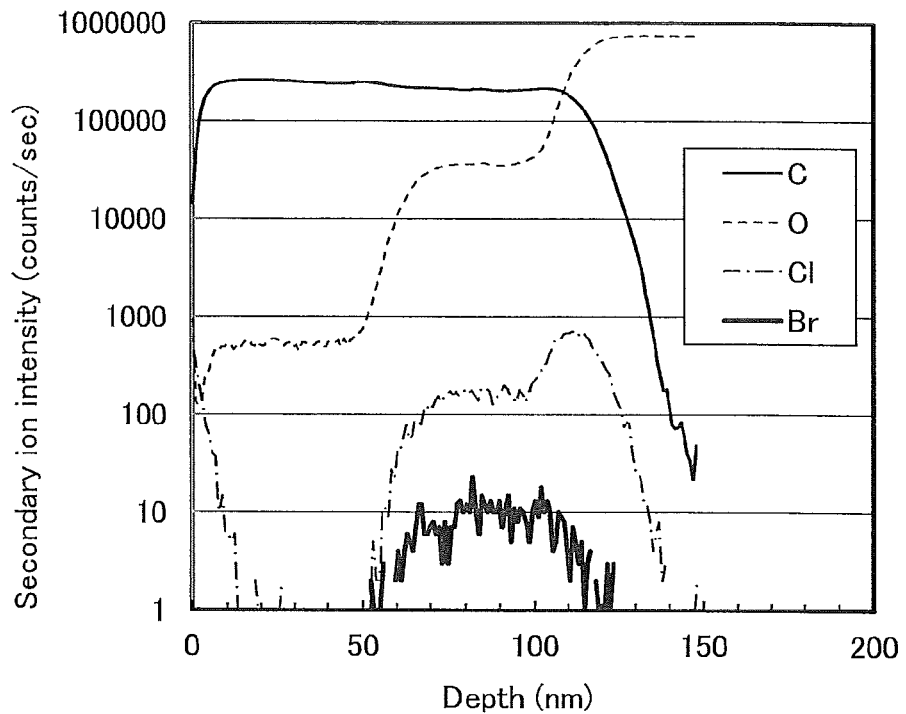
FIG. 24 shows measurement results of D-SIMS of the light-emitting element 2.
Figure 25:
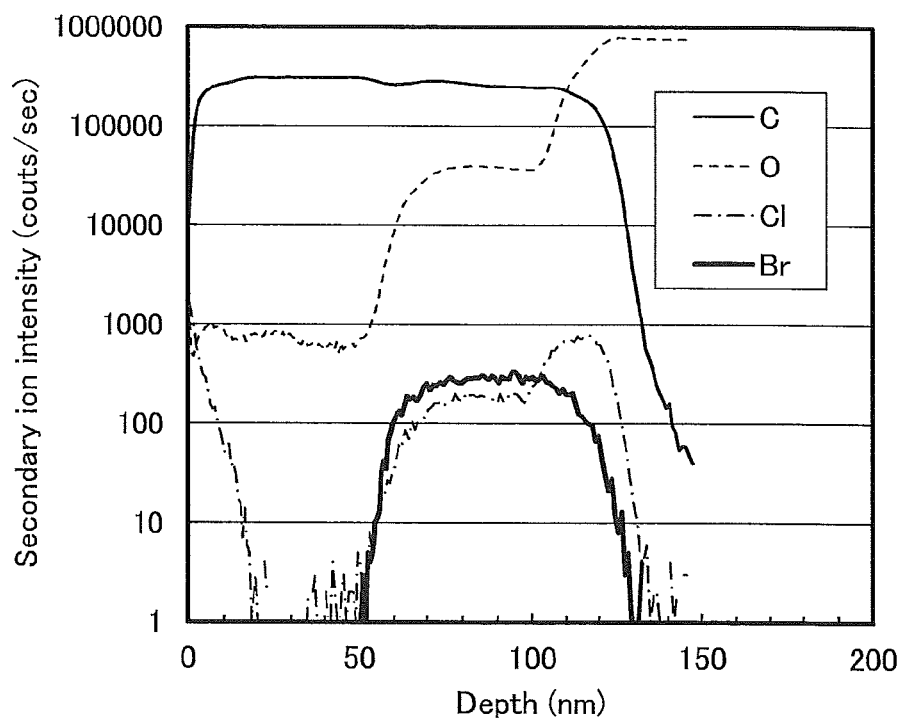
FIG. 25 shows measurement results of D-SIMS of the light-emitting element 3.

FIGS. 24 and 25 show measurement results of the light-emitting elements 2 and 3 by D-SIMS, respectively. Cs⁺ was used for a first ion. A primary acceleration voltage was 2.0 kV. Measurement was performed from the cathode side, and the scale of the horizontal axis was estimated from the ion intensity of oxygen elements. A depth of up to about 60 nm corresponds to the components from the electron-injection layer to the hole-transport layer, and a depth of from 60 nm to 110 nm corresponds to the hole-injection layer. It was found from the graphs that halogen elements (bromine and chlorine) can be detected in the first layers which are formed using the materials containing the bromides at a concentration of less than 0.1% or about 4%. Further, it was found that a difference of concentrations of bromine was also observed. As described above, although the light-emitting elements 2 and 3 of this example contain halogen elements in the hole-injection layer, they have favorable element characteristics equivalent to the light-emitting elements 1 and 4 which do not contain halogen elements in the light-emitting layer (which is in contact with the light-emitting layer) and the hole-transport layer (which contain halogen elements at a concentration below the detection limit of TOF-MS). In contrast, it was found that the light-emitting elements 5 and 6 in which materials containing halogen elements were used for the hole-transport layers are apparently reduced in durability.

Note that it is suggested that chlorine detected in the hole-injection layer is derived from chlorine contained in molybdenum oxide (purity: 3N8). When a deposition film of the molybdenum oxide was measured by D-SIMS, chlorine was detected about 10 count/sec and the ion intensity of bromine was below the detection limit.

From the above results, it was found that even if the hole-injection layer which is not in contact with the light-emitting layer contains halogen elements (particularly, bromine and chlorine), it does not heavily affect the emission characteristics and reliability. Therefore, it is not necessary to use, for the hole-injection layer, high impurity materials which are generally believed to be required by the conventional knowledge in the field of the organic EL element. Therefore, manufacturing cost can be greatly reduced. As an index, there are many advantages in terms of cost when a substance showing an ion intensity of halogen elements about $1/10000$ or more of that of carbon in the D-SIMS measurement. Although there is no upper limit of the concentration of halogen elements, it is preferable that ion intensity of halogen elements be $1/100$ or less of that of carbon in the D-SIMS measurement because it does not seem that element characteristics (e.g., driving voltage) tend to be affected.

The light-emitting region of the element of this example presumably exists at the interface between the hole-transport layer and the light-emitting layer. Therefore, even if halide elements (bromine and chlorine) are contained in the electron-transport layer which is in contact with the light-emitting layer, emission characteristics and reliability are not heavily affected. Therefore, there is less need to use high impurity materials, for the electron-transport layer, which are generally believed to be required by the conventional knowledge in the field of the organic EL element. As an index, it is preferable that the ion intensity of halogen elements be about $1/10000$ or more and $1/100$ or less of that of carbon in the D-SIMS measurement because both a cost advantage and preferred element characteristics (e.g., driving voltage) are easily realized.

On the other hand, it was found that a high purity material in which the amount of halides is reduced as much as possible need to be used for the hole-transport layer which is in contact with the light-emitting layer. As an index, it was found that the ion intensity of halogen elements is about less than 1/10000 (preferably less than 1/100000) of that of carbon in the D-SIMS measurement. This index can be applied to the light-emitting layer. With respect to the light-emitting materials, the same can be applied to the fluorescent material and the phosphorescent material.

Example 2

Quantitative measurement of the concentrations of halogen elements was more accurately carried out using combustion-ion chromatography on the following DBT3P-II samples: a sample (sample A) in which the concentration of the bromides was estimated by the UV detector of the UPLC to be about 1%; a sample (sample B) in which the concentration of the bromides by the UV detector is below the detection limit and the bromides can be detected by TOF-SIMS; and a sample (sample C) in which the concentration of the bromides is below the detection limit even by the TOF-SIMS. In this measurement, Automatic Quick Furnace AQF-2100H manufactured by Mitsubishi Chemical Analytech Co., Ltd was used, and for the subsequent ion chromatography, Ion Chromatography System Dionex ICS-2100 manufactured by Dionex Corporation was used. Note that the material of the sample B is synthesized in the same lot as the DBT3P-II used in the light-emitting element 2. It is confirmed that the sample C has element characteristics (current efficiency, driving voltage, and reliability) equivalent to those of the light-emitting element 4 in the case where the sample C is used for the hole-transport layer in the same structure as the light-emitting element 4.

The conditions of combustion and cracking are described below. The heater temperature in the inlet side was 900° C. and the heater temperature in the outlet side was 1000° C. The heating temperatures were adjusted by transferring a sample boat. The heating atmosphere was a mixed atmosphere of argon, humidified argon, and oxygen. As absorbing liquid, 5 mL of water in which 30 ppm of phosphoric acid was dissolved as an internal standard was used.

The conditions of ion chromatography are described. As eluent, an aqueous solution of KOH produced by an eluent generator was used. The flow rate was 1.0 mL/min, and the injected amount of the eluent was 100 μL. Dionex IonPac AS20 4 mm×250 mm was used as a separation column. The column temperature was 35° C. As a suppressor, ASRS was used, and the suppressor current was 100 mA. A conductivity detector was used as a detector, and the conductivity cell temperature was 35° C. The measurement results are shown in Table 4.

TABLE 4

| Sample | Halogen concentration (ppm) | | |
|---|---|---|---|
| | F | Cl | Br |
| A | 17 | 27 | 3396 |
| B | 0.18 | 0.31 | 160 |
| C | 0.44 | 0.37 | 6.01 |

Each of the concentrations of halogen elements of the samples has a good correlation with the concentration estimated by the UPLC detectors. From these results, it is found that, as long as the concentration of halogen contained in the light-emitting layer and/or the second layer is less than 10 ppm, the concentration of halogen of the first layer can be higher than that of the second layer and the light-emitting layer. Even if the concentration in the first layer is 3000 ppm or higher, the durability of elements is not affected; thus, an inexpensive light-emitting element can be obtained. On the other hand, it was found that the concentration of halogen in the second layer which is in contact with the light-emitting layer is preferably 100 ppm or lower, further preferably 10 ppm or lower.

EXPLANATION OF REFERENCE

101: first electrode, 102: second electrode, 103: EL layer, 111: first layer, 112: second layer, 113: light-emitting layer, 114: electron-transport layer, 115: electron-injection layer, 201: anode, 202: cathode, 211: hole-injection layer, 212: hole-transport layer, 213: light-emitting layer, 214: electron-transport layer, 215: electron-injection layer, 400: substrate, 401: first electrode, 403: EL layer, 404: second electrode, 405: sealant, 406: sealant, 407: sealing substrate, 412: pad, 420: IC chip, 501: first electrode, 502: second electrode, 511: first light-emitting unit, 512: second light-emitting unit, 513: charge generation layer, 601: driver circuit portion (source line driver circuit), 602: pixel portion, 603: driver circuit portion (gate line driver circuit), 604: sealing substrate, 605: sealant, 607: space, 608: wiring, 609: FPC (flexible printed circuit), 610: element substrate, 611: switching TFT, 612: current controlling TFT, 613: first electrode, 614: insulator, 616: EL layer, 617: second electrode, 618: light-emitting element, 623: n-channel TFT, 624: p-channel TFT, 901: housing, 902: liquid-crystal layer, 903: backlight unit, 904: housing, 905: driver IC, 906: terminal, 951: substrate, 952: electrode, 953: insulating layer, 954: partition layer, 955: EL layer, 956: electrode, 1001: substrate, 1002: base insulating film, 1003: gate insulating film, 1006: gate electrode, 1007: gate electrode, 1008: gate electrode, 1020: first interlayer insulating film, 1021: second interlayer insulating film, 1022: electrode, 1024W: first electrode of light-emitting element, 1024R: first electrode of light-emitting element, 1024G: first electrode of light-emitting element, 1024B: first electrode of light-emitting element, 1025: partition wall, 1028: EL layer, 1029: second electrode of light-emitting element, 1031: sealing substrate, 1032: sealant, 1033: transparent base material, 1034R: red layer, 1034G: green layer, 1034B: blue layer, 1035: black layer (black matrix), 1036: overcoat layer, 1037: third interlayer insulating film, 1040: pixel portion, 1041: driver circuit portion, 1042: peripheral portion, 2001: housing, 2002: light source, 3001: lighting device, 5000: display region, 5001: display region, 5002: display region, 5003: display region, 5004: display region, 5005: display region, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7210: second display portion, 7301: housing, 7302: housing, 7303: joint portion, 7304: display portion, 7305: display portion, 7306: speaker portion, 7307: recording medium insertion portion, 7308: LED lamp, 7309: operation key, 7310: connection terminal, 7311: sensor, 7401: housing, 7402: display portion, 7403: operation button, 7404: external connection port, 7405: speaker, 7406: microphone, 7400: mobile phone, 9033: hinge, 9034: switch, 9035: power switch, 9036: switch, 9037: operation switch, 9630: housing, 9631: display portion, 9631*a*: display portion, 9631*b*: display portion, 9632*a*: touchscreen region, 9632*b*: touchscreen region, 9633: solar cell, 9634: charge and discharge control circuit, 9635: battery, 9636: DCDC converter, 9638: converter, and 9639: button.

This application is based on Japanese Patent Application serial No. 2012-221243 filed with Japan Patent Office on Oct. 3, 2012, the entire contents of which are hereby incorporated by reference.

The invention claimed is:

1. A light-emitting device comprising:
   a hole-injection layer comprising a first compound over an anode, the hole-injection layer including a halogen element as an impurity;
   a hole-transport layer comprising a second compound over the hole-injection layer, the hole-transport layer including a halogen element as an impurity;
   a light-emitting layer comprising a host material and a light-emitting substance over the hole-transport layer, the light-emitting layer including a halogen element as an impurity;
   an electron-transport layer over the light-emitting layer;
   an electron-injection layer over the electron-transport layer; and
   a cathode over the electron-injection layer,
   wherein a concentration of the halogen element in the hole-injection layer is higher than a concentration of the halogen element in the hole-transport layer, and
      wherein the light-emitting layer has an electron-transport property higher than a hole-transport property thereof.

2. The light-emitting device according to claim 1,
   wherein the concentration of the halogen element in the hole-injection layer is higher than a concentration of the halogen element in the light-emitting layer.

3. The light-emitting device according to claim 1,
   wherein a ratio of the halogen element to a carbon element, which is estimated by dynamic secondary ion mass spectrometry, is less than $1/10000$ in the hole-transport layer, and
      wherein a ratio of the halogen element to a carbon element, which is estimated by dynamic secondary ion mass spectrometry, is more than or equal to $1/10000$ and less than or equal to $1/100$ in the hole-injection layer.

4. The light-emitting device according to claim 1,
   wherein the electron-transport layer comprises a halogen element as an impurity, and
   wherein a ratio of the halogen element to a carbon element, which is estimated by dynamic secondary ion mass spectrometry, is more than or equal to $1/10000$ and less than or equal to $1/100$ in the electron-transport layer.

5. The light-emitting device according to claim 1,
   wherein the halogen element in the hole-injection layer, the halogen element in the hole-transport layer, and the halogen element in the light-emitting layer is independently bromine or chlorine.

6. The light-emitting device according to claim 4,
   wherein the halogen element in the electron-transport layer is bromine or chlorine.

7. The light-emitting device according to claim 1,
   wherein the halogen element is bonded to the first compound.

8. The light-emitting device according to claim 1,
   wherein the halogen element is bonded to the second compound.

9. The light-emitting device according to claim 1,
   wherein the halogen element is bonded to the host material.

10. An electronic device comprising the light-emitting device according to claim 1.

11. A lighting device comprising the light-emitting device according to claim 1.

* * * * *